United States Patent
Choi et al.

(10) Patent No.: US 11,910,593 B2
(45) Date of Patent: Feb. 20, 2024

(54) GROUND-CONNECTED SUPPORTS WITH INSULATING SPACERS FOR SEMICONDUCTOR MEMORY CAPACITORS AND METHOD OF FABRICATING THE SAME

(71) Applicant: Samsung Electronics Co., Ltd., Suwon-si (KR)

(72) Inventors: Yoon Young Choi, Seoul (KR); Seung Jin Kim, Hwaseong-si (KR); Byung-Hyun Lee, Hwaseong-si (KR); Sang Jae Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/032,655

(22) Filed: Sep. 25, 2020

(65) Prior Publication Data

US 2021/0159230 A1   May 27, 2021

(30) Foreign Application Priority Data

Nov. 25, 2019 (KR) ........................ 10-2019-0151871

(51) Int. Cl.

| | |
|---|---|
| H01L 25/065 | (2023.01) |
| H01L 25/00 | (2006.01) |
| H01L 21/768 | (2006.01) |
| H01L 23/00 | (2006.01) |
| H01L 23/532 | (2006.01) |
| H01L 23/31 | (2006.01) |
| H01L 23/528 | (2006.01) |
| H01L 23/522 | (2006.01) |
| H01L 27/088 | (2006.01) |

(Continued)

(52) U.S. Cl.
CPC ............... *H10B 12/34* (2023.02); *G11C 5/10* (2013.01); *G11C 11/4023* (2013.01); *H01L 28/91* (2013.01)

(58) Field of Classification Search
CPC ............... H01L 28/91; H01L 27/10823; H01L 27/10852; H01L 28/87; H01L 28/56; H01L 27/10814; H01L 21/565; H01L 27/10855; H01L 23/3135; G11C 5/10; G11C 11/4023
See application file for complete search history.

(56) References Cited

U.S. PATENT DOCUMENTS

| | | | |
|---|---|---|---|
| 7,459,745 B2 | 12/2008 | Lee et al. | |
| 7,727,837 B2 | 6/2010 | Gruening-von Schwerin et al. | |

(Continued)

OTHER PUBLICATIONS

Extended European Search Report dated Apr. 16, 2021 in European Application No. 20188852.6.

(Continued)

*Primary Examiner* — Marcos D. Pizarro
*Assistant Examiner* — Tenley H Schofield
(74) *Attorney, Agent, or Firm* — Harness, Dickey & Pierce, P.L.C.

(57) ABSTRACT

A semiconductor device may comprise: a plurality of lower electrodes which are on a substrate; a first electrode support which is between adjacent lower electrodes and comprises a metallic material; a dielectric layer which is on the lower electrodes and the first electrode support to extend along profiles of the first electrode support and each of the lower electrodes; and an upper electrode which is on the dielectric layer.

20 Claims, 40 Drawing Sheets

(51) Int. Cl.
  *H10B 12/00* (2023.01)
  *G11C 5/10* (2006.01)
  *G11C 11/402* (2006.01)
  *H01L 49/02* (2006.01)

(56) References Cited

U.S. PATENT DOCUMENTS

| | | | |
|---|---|---|---|
| 7,871,891 B2 | 1/2011 | Cho et al. | |
| 8,581,315 B2 | 11/2013 | Isogai et al. | |
| 8,614,498 B2* | 12/2013 | Park | H01L 28/91 |
| | | | 257/532 |
| 8,643,075 B2* | 2/2014 | Kim | H01L 28/60 |
| | | | 257/306 |
| 8,779,549 B2 | 7/2014 | Kim et al. | |
| 9,147,685 B2 | 9/2015 | Byun et al. | |
| 9,263,536 B2 | 2/2016 | Kim et al. | |
| 9,553,141 B2 | 1/2017 | Yang et al. | |
| 9,601,494 B2 | 3/2017 | Kim et al. | |
| 10,032,778 B2 | 7/2018 | Kim et al. | |
| 2003/0132429 A1* | 7/2003 | Kim | H01L 27/10894 |
| | | | 257/E21.507 |
| 2004/0080051 A1 | 4/2004 | Kawai | |
| 2009/0068814 A1* | 3/2009 | Cho | H01L 27/0207 |
| | | | 438/386 |
| 2009/0251845 A1* | 10/2009 | Kiehlbauch | H01G 4/012 |
| | | | 361/301.1 |
| 2012/0205733 A1* | 8/2012 | Kang | H01L 27/10894 |
| | | | 257/311 |
| 2013/0093050 A1 | 4/2013 | Busch et al. | |
| 2013/0164902 A1* | 6/2013 | Greeley | H01L 21/32133 |
| | | | 438/381 |
| 2014/0030863 A1 | 1/2014 | Lugani et al. | |
| 2014/0134839 A1* | 5/2014 | Kim | H01L 27/10814 |
| | | | 438/675 |
| 2015/0236084 A1* | 8/2015 | Park | H01L 21/31116 |
| | | | 438/396 |
| 2016/0005806 A1* | 1/2016 | Yang | H01L 28/87 |
| | | | 257/532 |
| 2016/0365351 A1* | 12/2016 | Nishikawa | H01L 28/20 |

OTHER PUBLICATIONS

Partial European Search Report dated Jan. 15, 2021 in European Application No. 20188852.6.

* cited by examiner

GROUND-CONNECTED SUPPORTS WITH INSULATING SPACERS FOR SEMICONDUCTOR MEMORY CAPACITORS AND METHOD OF FABRICATING THE SAME

This U.S. non-provisional application claims the benefit of priority under 35 U.S.C. § 119 Korean Patent Application No. 10-2019-0151871, filed on Nov. 25, 2019, in the Korean Intellectual Property Office (KIPO), the entire disclosure of which is incorporated herein in its entirety by reference.

BACKGROUND

1. Field

The present disclosure relates to a semiconductor device, and more particularly, to a semiconductor device that comprises a conductive electrode extending in a direction and a support structure supporting the conductive electrode.

2. Description of the Related Art

As semiconductor devices become more integrated larger capacitance and higher integration density is beneficial, leading to design rules being continuously reduced. This trend is noticeable in dynamic random access memory (DRAM) which is a type the semiconductor memory device, which is provided a smaller footprint in more integrated devices. However, in order for a DRAM device to operate, more than a certain level of capacitance is required in each cell, which may be hindered by the smaller footprint, as capacitance is a function of the surface area of the capacitor's electrode.

To this end, research is being conducted on utilizing a dielectric layer having a high dielectric constant in a capacitor and/or increasing a contact area between a lower electrode of the capacitor and the dielectric layer, for example, a capacitor wherein the contact area between the capacitor and the dielectric layer increases when the height of the lower electrode is increased, thereby increasing the capacitance of the capacitor.

To prevent the lower electrode from tilting or collapsing due to the increased height of the lower electrode, the use of a support structure capable of supporting the lower electrode has been suggested.

SUMMARY

Aspects related to various example embodiments of the present inventive concepts provide a semiconductor device in which an electrode support supporting a lower electrode is connected to a ground voltage to improve the performance and reliability of the device.

Aspects related to various example embodiments of the present inventive concepts also provide a method of fabricating a semiconductor device in which an electrode support supporting a lower electrode is connected to a ground voltage to improve the performance and reliability of the device.

According to some example embodiments of the present inventive concepts, a semiconductor device comprises: a plurality of lower electrodes on a substrate; a first electrode support between adjacent lower electrodes and comprises a conductive material; a dielectric layer on the plurality of lower electrodes and the first electrode support extending along profiles of the plurality of first electrode support and each of the lower electrodes; and an upper electrode on the dielectric layer.

According to some example embodiments of the present inventive concepts, a semiconductor device comprises: a plurality of lower electrodes on a substrate; an electrode support, comprising a conductive material, between adjacent lower electrodes of the plurality of lower electrodes, and comprising a support exposed area on an upper surface of the electrode support; a dielectric layer on the electrode support and the lower electrodes but not on the support exposed area of the electrode support; an upper electrode on the dielectric layer; an upper plate electrode on the upper electrode and electrically connected to the electrode support; and a ground plug connected to the upper plate electrode.

According to some example embodiments of the present inventive concepts, a semiconductor device comprises: an electrode support on a substrate and defining a plurality of lower electrode holes; insulating spacers on sidewalls of each of the lower electrode holes; a plurality of lower electrodes in the lower electrode holes and spaced apart from the electrode support by the insulating spacer; a dielectric layer on the lower electrodes and the electrode support; and an upper electrode on the dielectric layer and electrically connected to the electrode support. However, aspects of the example embodiments of the present inventive concepts are not restricted to the ones set forth herein. The above and other aspects of the example embodiments will become more apparent to one of ordinary skill in the art to which the example embodiments pertain by referencing the detailed description of the example embodiments of the present inventive concepts given below.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Drawings relating to a semiconductor device according to example embodiments of the present inventive concepts illustrate a capacitor and electrode supports included in a dynamic random access memory (DRAM).

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure. §

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Spatially relative terms, such as "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" other elements or features would then be oriented "above" the other elements or features. Thus, the example terms "lower" and "upper" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Figure 1:
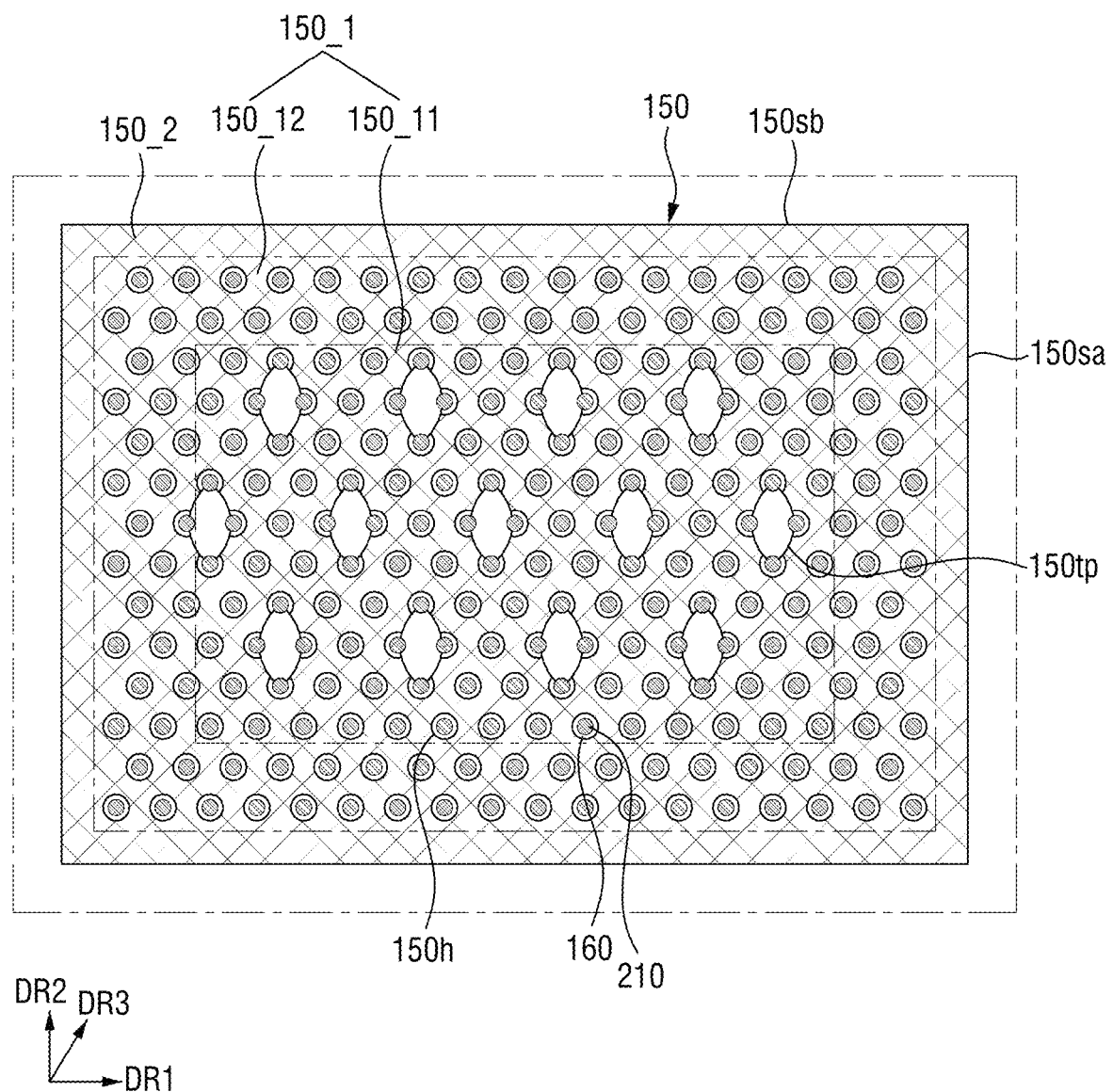
FIGS. 1 and 2 are plan views of a semiconductor device according to at least one example embodiment of the present inventive concepts.
Figure 2:
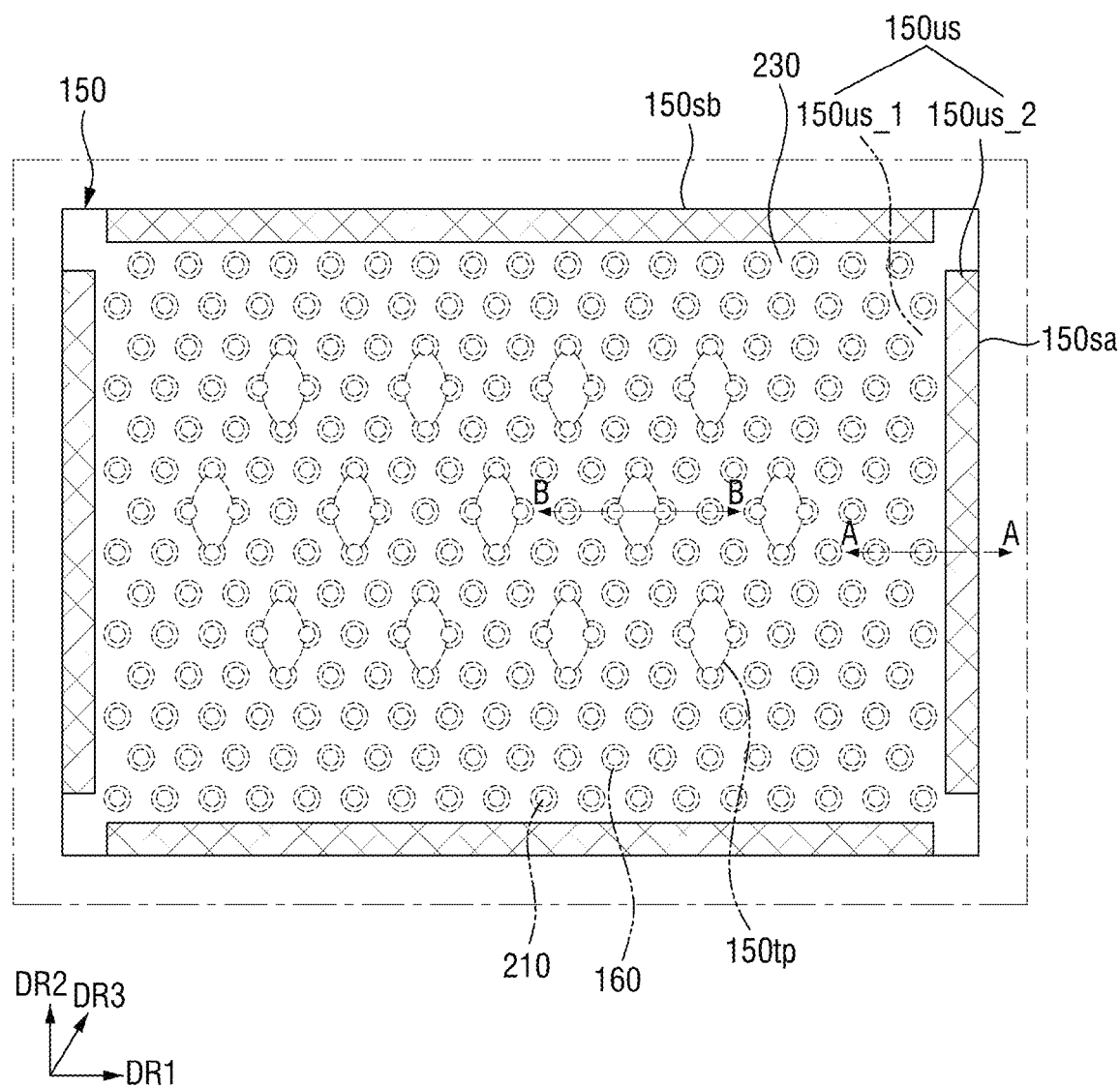
Figure 3:
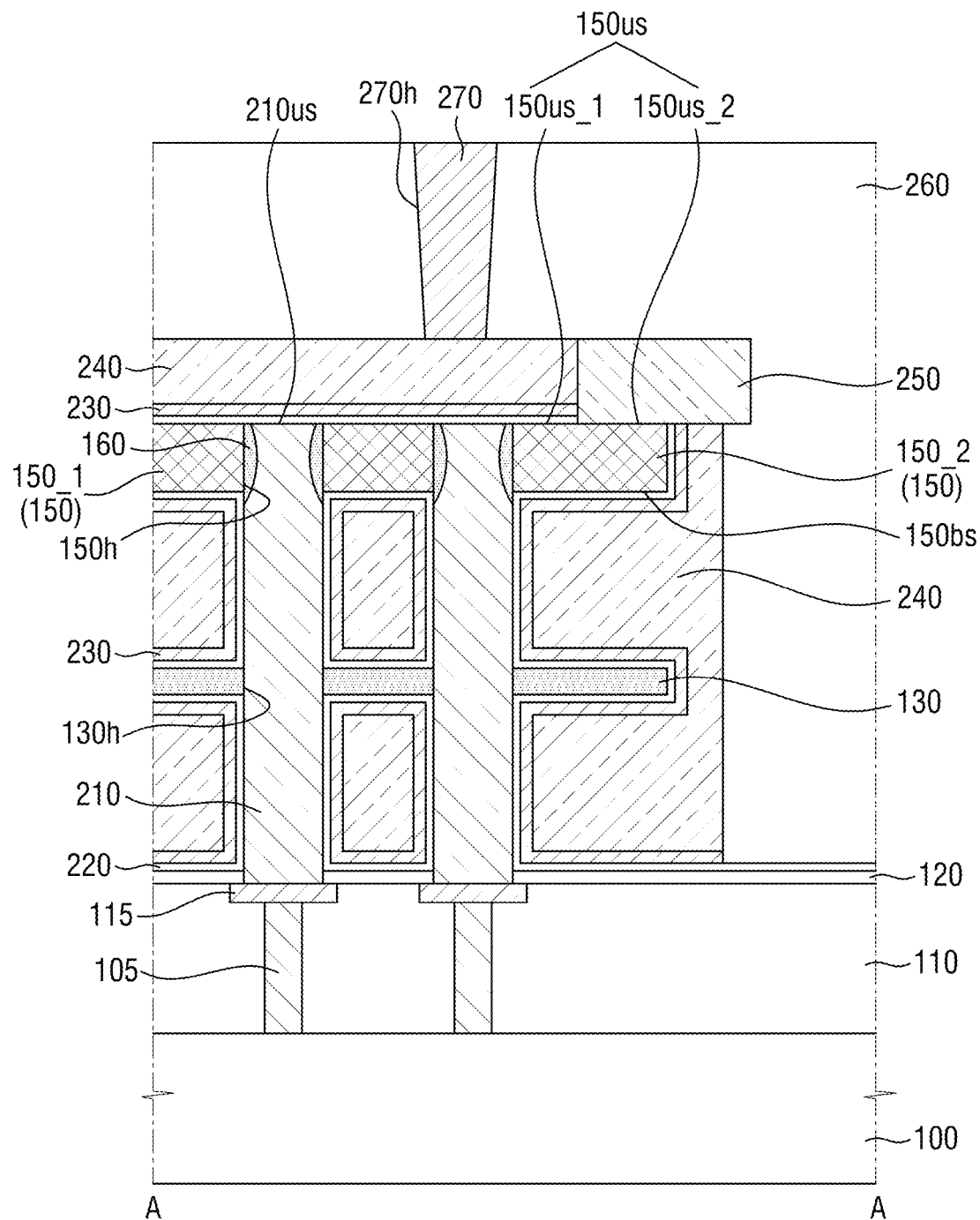
FIGS. 3 and 4 are cross-sectional views taken along A-A and B-B of FIG. 2.
Figure 4:
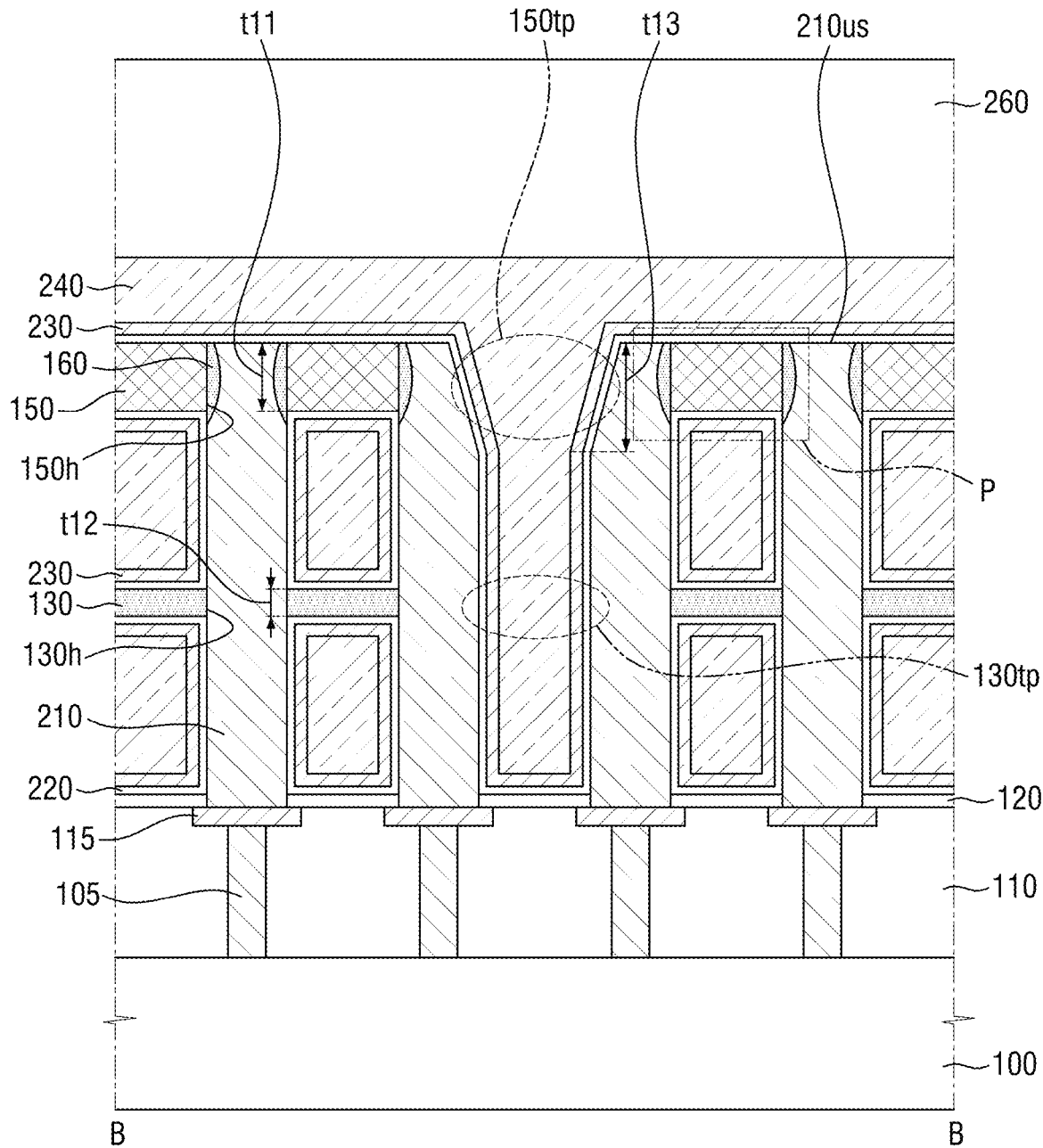
Figure 5:
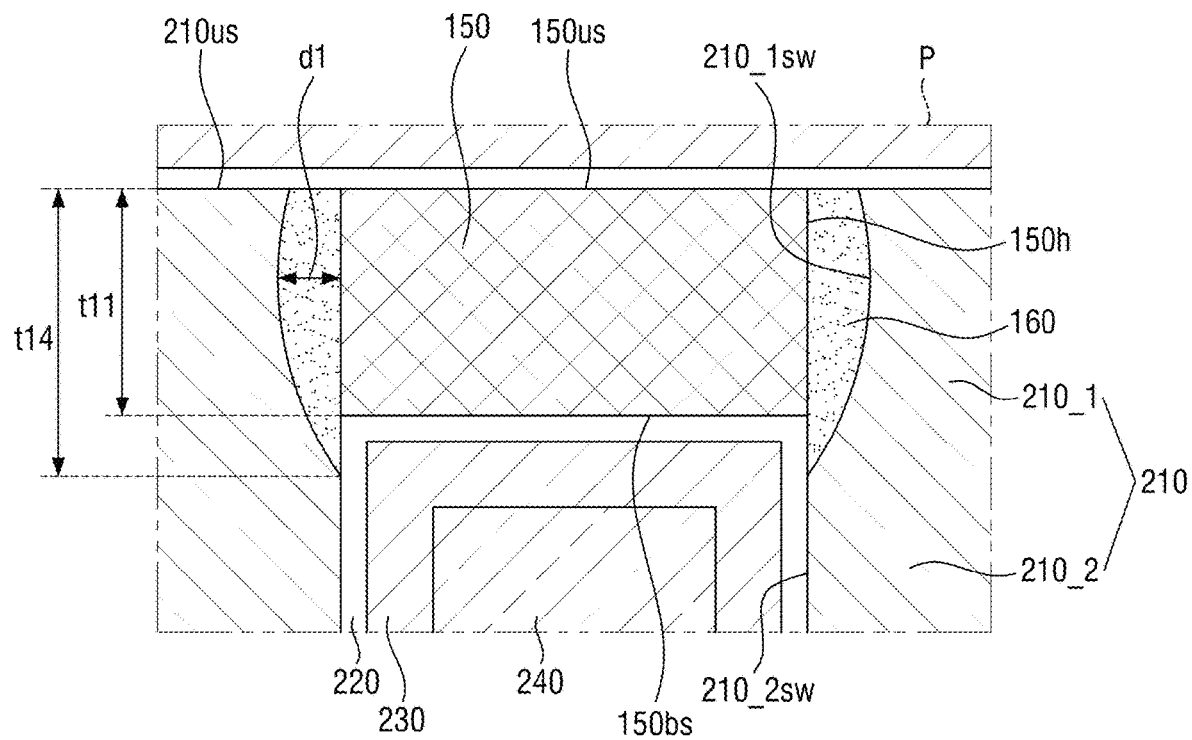
FIG. 5 is an enlarged view of a part P of FIG. 4.

FIGS. 1 and 2 are plan views of a semiconductor device according to at least one example embodiment of the present inventive concepts. FIGS. 3 and 4 are cross-sectional views taken along A-A and B-B of FIG. 2. FIG. 5 is an enlarged view of a part P of FIG. 4.

For reference, FIG. 1 is a plan view of lower electrodes 210 and a second electrode support 150 of the semiconductor device. FIG. 2 is an example plan view of an upper electrode 230 formed on the lower electrodes 210 and the second electrode support 150 of FIG. 1. FIGS. 3 and 4 are examples of cross-sectional views of an upper plate electrode 240 and a first ground plug 270 on the upper electrode 230 of FIG. 2.

Referring to FIGS. 1 through 5, the semiconductor device according to the embodiments may include a plurality of lower electrodes 210, a first electrode support 130, the second electrode support 150, insulating spacers 160, a capacitor dielectric layer 220, the upper electrode 230, the upper plate electrode 240, and the first ground plug 270.

First landing pads 115 may be on a substrate 100. The first landing pads 115 may be connected to the substrate 100. The first landing pads 115 may be electrically connected to conductive areas formed on the substrate 100 or in the substrate 100. The first landing pads 115 may be connected to the substrate 100 via first storage contacts 105. The first landing pads 115 may be on the first storage contacts 105, respectively.

A first interlayer insulating film 110 may be on the substrate 100. The first storage contacts 105 and the first landing pads 115 may be in the first interlayer insulating film 110 on the substrate 100. The substrate 100 may be a silicon substrate like bulk silicon or silicon-on-insulator (SOI). Alternatively, the substrate 100 may be, but is not limited to, a semiconductor substrate, like a substrate including silicon germanium, silicon germanium on insulator (SGOI), indium antimonide, lead telluride, indium arsenide, indium phosphide, gallium arsenide, and/or gallium antimonide. In the following description, the substrate 100 will be described as a silicon substrate.

The first interlayer insulating film 110 may include an insulator material, for example, at least one of silicon oxide, silicon nitride, silicon oxynitride (SiON), silicon oxycarbonitride (SiOCN), and/or combinations of the same. The first storage contacts 105 may include, for example, at least one of a semiconductor material doped with impurities, a conductive silicide compound, a conductive metal nitride, a metal, and/or a combination thereof. The first landing pads 115 may include, for example, at least one of a semiconductor material doped with impurities, a conductive silicide compound, a conductive metal nitride, a metal, and/or a combination thereof. In the semiconductor device according to an example embodiment, the first landing pads 115 may include tungsten (W). The first landing pads 115 and the first storage contacts may include the same or different materials.

A first etch stop layer 120 may be on the first interlayer insulating film 110. The first etch stop layer 120 may expose at least a part of each of the first landing pads 115. For example, the first etch stop layer 120 may be on the first landing pads 115. The first etch stop layer 120 may include electrode pad openings which at least partially expose the first landing pads 115. The first etch stop layer 120 may include, for example, at least one of silicon nitride (SiN), silicon carbo nitride (SiCN), silicon boron nitride (SiBn), silicon oxycarbide (SiCO), silicon oxynitride (SiON), silicon oxide (SiO), and silicon oxycarbonite (SiOCN). Herein, unless otherwise specifically indicated, the atomic abbreviations indicate the comprising atomic composition of the material but do not include or limit the ratio of atoms in the material. For example, silicon oxycarbide (SiCO) indicates that it contains silicon (Si), carbon (C) and oxygen (O) and does not indicate a specific 1:1:1 ratio between silicon (Si), carbon (C) and oxygen (O).

The lower electrodes 210 may be on the substrate 100. The lower electrodes 210 may be on the first landing pads 115 and may be connected to the first landing pads 115. A part of each of the lower electrodes 210 may be in the first etch stop layer 120. The lower electrodes 210 may pass through the first etch stop layer 120 and connected to the first landing pads 115.

For example, each of the lower electrodes 210 may be shaped like a pillar. For example, the lower electrodes 210 may include a cylinder (e.g., with a circular or ovoid cross-section) and/or may include a polygonal cross-section. The lower electrodes 210 may extend in a thickness direction of the substrate 100 (e.g., extending in a direction away from the upper surface of the substrate 100). A length to which the lower electrodes 210 extend in the thickness direction of the substrate 100 may be greater than a length to which the lower electrodes 210 extend in a direction DR1, DR2, or DR3 parallel to the substrate 100.

The lower electrodes 210 may be repeatedly aligned along a first direction DR1 and a second direction DR2. The first direction DR1 and the second direction DR2 may be orthogonal to each other. The lower electrodes 210 repeatedly aligned in the first direction DR1 may also be repeatedly aligned in the second direction DR2. The lower electrodes 210 repeatedly aligned in the second direction DR2 may not be linearly arranged along the second direction DR2. The lower electrodes 210 repeatedly aligned in the second direction DR2 may be arranged in a zigzag pattern. The lower electrodes 210 may be linearly arranged along a third direction DR3.

The lower electrodes 210 may include, but are not limited to, a doped semiconductor material, a conductive metal nitride (such as titanium nitride, tantalum nitride, niobium nitride or tungsten nitride), a metal (such as ruthenium, iridium, titanium or tantalum), and/or a conductive metal oxide (such as iridium oxide or niobium oxide). In the semiconductor device according to the example embodiments, the lower electrodes 210 may include titanium nitride (TiN). Alternatively, in the semiconductor device according to another example embodiment, the lower electrodes 210 may include niobium nitride (NbN).

The first electrode support 130 may be on the first etch stop layer 120. The first electrode support 130 may be spaced apart from the first etch stop layer 120. The first electrode support 130 may be between adjacent lower electrodes 210.

The first electrode support 130 may include a plurality of first electrode holes 130h formed at positions corresponding to the lower electrodes 210. The lower electrodes 210 may penetrate the first electrode holes 130h in the thickness direction of the substrate 100. The first electrode support 130 may contact the lower electrodes 210. The first electrode support 130 may partially contact sidewalls of the lower electrodes 210. The first electrode support 130 may contact the lower electrodes 210 at the first electrode holes 130h.

The first electrode support 130 may include first through patterns 130tp formed between adjacent lower electrodes 210. A description of the first through patterns 130tp may be similar to a description of second through patterns 150tp to be given later.

The first electrode support 130 may include an insulating material, for example, at least one of silicon nitride, silicon carbonitride, silicon boron nitride, silicon oxycarbide, silicon oxynitride, silicon oxide, and silicon oxycarbonitride.

The second electrode support 150 may be on the first electrode support 130. The second electrode support 150 may be spaced apart from the first electrode support 130. The second electrode support 150 may be between adjacent lower electrodes 210. The second electrode support 150 may include a plurality of second electrode holes 150h formed at positions corresponding to the lower electrodes 210. The lower electrodes 210 may penetrate the second electrode holes 150h. The second electrode support 150 may be spaced apart from and, thus, not contact the lower electrodes 210.

The second electrode support 150 may include the second through patterns 150tp formed between adjacent lower electrodes 210. The second through patterns 150tp may be formed at positions corresponding to the first through patterns 130tp. The first through patterns 130tp and the second through patterns 150tp may overlap in the thickness direction of the substrate 100. The first through patterns 130tp and the second through patterns 150tp may be formed in the process of forming the first electrode support 130 and the second electrode support 150.

The second electrode support 150 may include a conductive material, for example, a metallic material. The second electrode support 150 may include at least one of, for example, a semiconductor material doped with impurities, a conductive silicide compound, a conductive metal nitride, and a metal. In the following description, the second electrode support 150 will be described as including a metallic material.

Each of the first through patterns 130tp and the second through patterns 150tp may be formed over a plurality of adjacent lower electrodes 210. In the semiconductor device according to an example embodiment, each of the first through patterns 130tp and the second through patterns 150tp may be formed between four adjacent lower electrodes 210. Four lower electrodes 210 meeting one second through pattern 150tp may be at vertices of a quadrangle. The lower electrodes 210 are not in the first through patterns 130tp and the second through patterns 150tp.

In FIG. 1, one lower electrode 210 not meeting the second through patterns 150tp is located between the second through patterns 150tp adjacent to each other in the first direction DR1. However, embodiments are not limited to this case. For example, no lower electrode 210 not meeting the second through patterns 150tp may be located between the second through patterns 150tp adjacent to each other in the first direction DR1. Alternatively, two or more lower electrodes 210 not meeting the second through patterns 150tp may be located between the second through patterns 150tp adjacent to each other in the first direction DR1.

The second electrode support 150 may include an electrode support part 150_1 in which the second electrode holes 150h are formed and an edge part 150_2 along the edges of the electrode support part 150_1 and surrounds the electrode support part 150_1. The edge part 150_2 of the second electrode support 150 may define a boundary of the second electrode support 150. The edge part 150_2 of the second electrode support 150 may be a part located further out than outermost lower electrodes 210.

The electrode support part 150_1 of the second electrode support 150 may include an inner support area 150_11 in which the second through patterns 150tp are formed and an outer support area 150_12 in which the second through patterns 150tp are not formed.

The second electrode support 150 includes an upper surface 150us and a lower surface 150bs facing each other. For example, the lower surface 150bs of the second electrode support 150 may face the substrate 100. The second electrode holes 150*h* may connect the upper surface 150*us* of the second electrode support 150 and the lower surface 150*bs* of the second electrode support 150. Although the upper surface 150*us* of the second electrode support 150 is illustrated as lying in the same plane as an upper surface 210*us* of each lower electrode 210, embodiments are not limited to this case. For example, some and/or all of the lower electrodes 210 may also protrude above the upper surface 150*us* of the second electrode support 150.

The upper surface 150*us* of the second electrode support 150 may include first boundary lines 150*sb* extending in the first direction DR1 and second boundary lines 150*sa* extending in the second direction DR2. The first boundary lines 150*sb* of the second electrode support 150 and the second boundary lines 150*sa* of the second electrode support 150 may form the boundary of the second electrode support 150.

In FIG. 1, the first boundary lines 150*sb* of the second electrode support 150 and the second boundary lines 150*sa* of the second electrode support 150 are directly connected to each other. However, this is merely an example used for ease of description, and embodiments are not limited to this example. The first boundary lines 150*sb* of the second electrode support 150 and the second boundary lines 150*sa* of the second electrode support 150 may also be connected by a connection boundary, and the connection boundary may include various shapes such as a straight line, a curve, a step shape, and/or a wavy shape.

The upper surface 150*us* of the second electrode support 150 may include an unexposed area 150*us*_1 covered by the capacitor dielectric layer 220 and the upper electrode 230 and an exposed area 150*us*_2 not covered by the capacitor dielectric layer 220 and the upper electrode 230. The exposed area 150*us*_2 of the upper surface 150*us* of the second electrode support 150 is a part on which the capacitor dielectric layer 220 and the upper electrode 230 are not formed. The edge part 150_2 of the second electrode support 150 includes the exposed area 150*us*_2 of the upper surface 150*us* of the second electrode support 150. For example, the exposed area 150*us*_2 of the upper surface 150*us* of the second electrode support 150 may be shaped like a rectangle extending in the first direction DR1 or the second direction DR2.

In the semiconductor device according to the example embodiments, the exposed area 150*us*_2 of the upper surface 150*us* of the second electrode support 150 may extend along the first boundary lines 150*sb* of the second electrode support 150 and the second boundary lines 150*sa* of the second electrode support 150.

In FIG. 2, the exposed area 150*us*_2 of the second electrode support 150 extending along each of the first boundary lines 150*sb* and the exposed area 150*us*_2 of the second electrode support 150 extending along each of the second boundary lines 150*sa* do not meet each other. However, embodiments are not limited to this case. Unlike in the drawing, the exposed area 150*us*_2 of the upper surface 150*us* of the second electrode support 150 may also extend along the entire boundary of the second electrode support 150. Unlike in the drawing, the exposed area 150*us*_2 of the upper surface 150*us* of the second electrode support 150 may also extend along one of the two first boundary lines 150*sb* facing each other. In addition, the exposed area 150*us*_2 of the upper surface 15-*us* of the second electrode support 150 may extend along one of the two second boundary lines 150*sa* facing each other.

In the semiconductor device according to the embodiments, a thickness t11 of the second electrode support 150 in the thickness direction of the substrate 100 may be greater than a thickness t12 of the first electrode support 130. Unlike in the drawings, the first electrode support 130 including an insulating material may not be between the second electrode support 150 and the first etch stop layer 120. That is, only one electrode support may support the lower electrodes 210.

The insulating spacers 160 may be between the second electrode support 150 and the lower electrodes 210. The insulating spacers 160 may be along boundaries between the second electrode support 150 and the lower electrodes 210.

The lower electrodes 210 and the second electrode support 150 may be spaced apart by the insulating spacers 160. The insulating spacers 160 may electrically insulate the lower electrodes 210 from the second electrode support 150 including a conductive material.

The insulating spacers 160 may be formed on sidewalls of the second electrode holes 150*h*. The insulating spacers 160 may entirely cover the sidewalls of the lower electrodes 210, which define the second electrode holes 150*h* that form boundaries with the lower electrodes 210.

Each of the lower electrodes 210 may include an overlap area 210_1 which laterally overlaps the insulating spacers 160 and a non-overlap area 210_2 which does not laterally overlap the insulating spacers 160. The insulating spacers 160 may partially cover the sidewalls of each of the lower electrodes 210. The insulating spacers 160 may cover sidewalls 210_1*sw* of the overlap area 210_1 of each of the lower electrodes 210. The insulating spacers 160 do not cover sidewalls 210_2*sw* of the non-overlap area 210_2 of each of the lower electrodes 210.

In the semiconductor device according to the embodiments, a distance t14 from the upper surface 150*us* of the second electrode support 150 to a bottom of each insulating spacer 160 may be greater than the thickness t11 of the second electrode support 150.

Each of the insulating spacers 160 may include a part whose thickness d1 increases as a distance from the substrate 100 increases. For example, a part of an insulating spacer 160 on a part of each sidewall 210_1*sw* of each lower electrode 210 may become thicker as the distance from the substrate 100 increases. In FIG. 5, the thickness d1 of each insulating spacer 160 increases and then decreases as the distance from the substrate 100 increases, but embodiments are not limited to this case. That is, the thickness d1 of each insulating spacer 160 may increase and then remain constant as the distance from the substrate 100 increases.

In each part where a second through pattern 150*tp* is formed, upper parts of lower electrodes 210, which meet the second through pattern 150*tp*, may be chamfered. In the semiconductor device according to the embodiments, a height t13 of each of the chamfered parts of the lower electrodes 210 may be greater than the distance t14 from the upper surface 150*us* of the second electrode support 150 to the bottom of each insulating spacer 160. For example, in each part where the second through pattern 150*tp* is formed, the insulating spacers 160 may not be on the sidewalls of the lower electrodes 210 that meet the second through pattern 150*tp*. The insulating spacers 160 may not be on the sidewalls of the lower electrodes 210 in each part overlapping the second through pattern 150*tp*.

The insulating spacers 160 may include an insulating material, for example, at least one of silicon oxide, silicon carbonitride, silicon nitride, silicon oxycarbide, silicon oxynitride, and a high dielectric constant (high-k) material containing a metal. The high-k material containing a metal may include one of, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations of the same. In the semiconductor device according to the example embodiments, the insulating spacers 160 may include an insulating material having a higher dielectric constant than silicon oxide. For example, the insulating spacers 160 may include silicon carbonitride.

The capacitor dielectric layer 220 may be formed on the lower electrodes 210, the first electrode support 130, and the second electrode support 150. The capacitor dielectric layer 220 may extend along the profile of the lower electrodes 210, upper and lower surfaces of the first electrode support 130, the upper surface 150us of the second electrode support 150, and the lower surface 150bs of the second electrode support 150. The capacitor dielectric layer 220 does not extend between the second electrode support 150 and the insulating spacers 160. The capacitor dielectric layer 220 may include an insulator material, for example, at least one of silicon oxide (SiO2), silicon nitride (SiN), silicon oxynitride (SiON), and/or a high-k material containing a metal. Although the capacitor dielectric layer 220 is illustrated as being a single layer, this is merely an example used for ease of description and illustration, and embodiments are not limited to this example. For example, according to an example embodiment, the capacitor dielectric layer 220 in the semiconductor device may include a structure with sequentially stacked dielectric layers, for example, a structure in which zirconium oxide, aluminum oxide, and zirconium oxide are sequentially stacked.

In the semiconductor device according to the example embodiments, the capacitor dielectric layer 220 may include a dielectric layer including hafnium (Hf). In the semiconductor device according to the example embodiments, the capacitor dielectric layer 220 may have a stacked structure of a ferroelectric material layer and a paraelectric material layer.

The ferroelectric material layer may have ferroelectric properties. The ferroelectric material layer may be thick enough to have ferroelectric properties. The thickness range of the ferroelectric material layer having ferroelectric properties may vary according to a ferroelectric material.

For example, the ferroelectric material layer may include a monometal oxide. The ferroelectric material layer may include a monometal oxide layer. Here, the monometal oxide may be a binary compound composed of one metal and oxygen. The ferroelectric material layer including the monometal oxide may have an orthorhombic crystal system.

In an example, the metal included in the monometal oxide layer may be hafnium (Hf). The monometal oxide layer may be a hafnium oxide (HfO) layer. Here, the hafnium oxide layer may have a chemical formula that conforms to stoichiometry or may have a chemical formula that does not conform to stoichiometry.

In another example, the metal included in the monometal oxide layer may be one of rare earth metals belonging to lanthanoids. The monometal oxide layer may include a rare earth metal oxide layer including a metal belonging to lanthanoids. Here, the rare earth metal oxide layer including a metal belonging to lanthanoids may have a chemical formula that conforms to stoichiometry or may have a chemical formula that does not conform to stoichiometry. When the ferroelectric material layer includes the monometal oxide layer, it may have a thickness of, for example, 1 nm to 10 nm.

In another example embodiment, the ferroelectric material layer may include a bimetal oxide. The ferroelectric material layer may include a bimetal oxide layer. Here, the bimetal oxide may be a ternary compound comprising two metals and oxygen. The ferroelectric material layer including the bimetal oxide may have an orthorhombic crystal system.

The metal included in the bimetal oxide layer may be, for example, hafnium (Hf) and zirconium (Zr). The bimetal oxide layer may be a hafnium zirconium oxide (HfZrO). For example, the bimetal oxide layer may include a ($Hf_xZr_{(1-x)}$O) layer, wherein x may be 0.2 to 0.8. Here, the hafnium zirconium oxide (HfZrO) layer may have a chemical formula that conforms to stoichiometry or may have a chemical formula that does not conform to stoichiometry.

When the ferroelectric material layer includes the bimetal oxide layer, it may have a thickness of, for example, 1 nm to 20 nm.

The paraelectric material layer may be a dielectric layer including zirconium (Zr) or a stacked layer including zirconium (Zr). The paraelectric material layer may comprise the same chemical formula as the ferroelectric material layer. Although the chemical formula may be the same, the exhibited ferroelectric properties and/or paraelectric properties of the material layers may depend from the crystal structure of the dielectric material.

The paraelectric material may have a positive dielectric constant, and the ferroelectric material may have a negative dielectric constant in a specific section of capacitor dielectric layer 220. That is, the paraelectric material may have a positive capacitance, and the ferroelectric material may have a negative capacitance.

Generally, when two or more capacitors having a positive capacitance are connected in series, the sum of the capacitances decreases. However, when a capacitor having a negative capacitance and a capacitor having a positive capacitance are connected in series the sum of the capacitances increases.

The upper electrode 230 may be on the capacitor dielectric layer 220. The upper electrode 230 may extend along the profile of the capacitor dielectric layer 220. The upper electrode 230 may include, but is not limited to, a doped semiconductor material, a conductive metal nitride (such as titanium nitride, tantalum nitride, niobium nitride or tungsten nitride), a metal (such as ruthenium, iridium, titanium or tantalum), and/or a conductive metal oxide (such as iridium oxide or niobium oxide). In the semiconductor device according to the embodiments, the upper electrode 230 may include titanium nitride (TiN) and/or niobium nitride (NbN).

The upper plate electrode 240 may be on the upper electrode 230. The upper plate electrode 240 may be above an area defined within the exposed area 150us_2 of the upper surface 150us of the second electrode support 150 and on the unexposed area 150us_1 of the upper surface 150us of the second electrode support 150. For example, the upper plate electrode 240 may not be formed on the exposed area 150us_2 of the upper surface of the second electrode support 150, and/or the upper plate electrode 240 may not cover the exposed area 150us_2 of the upper surface of the second electrode support 150.

The upper plate electrode 240 may include at least one of, for example, an elemental semiconductor material layer and/or a compound semiconductor material layer. The upper plate electrode 240 may include doped n-type or p-type impurities.

A support connection pattern 250 may be on the exposed area 150*us*_2 of the upper surface of the second electrode support 150. The support connection pattern 250 may cover the exposed area 150*us*_2 of the upper surface of the second electrode support 150 on which the capacitor dielectric layer 220, the upper electrode 230 and the upper plate electrode 240 are not formed. The support connection pattern 250 may be connected to the second electrode support 150. The support connection pattern 250 may be connected to the upper plate electrode 240. The support connection pattern 250 may connect the second electrode support 150 and the upper plate electrode 240. The second electrode support 150 may be electrically connected to the upper plate electrode 240 through the support connection pattern 250. The upper plate electrode 240 may be electrically connected to the second electrode support 150 through the exposed area 150*us*_2 of the upper surface of the second electrode support 150.

In an example embodiment, a part of the support connection pattern 250 may protrude in a lateral direction (e.g., the first direction DR1) further than a sidewall of the second electrode support 150. Although the support connection pattern 250 laterally protrudes further than a sidewall of the upper plate electrode 240 in FIG. 3, embodiments are not limited to this case.

For example, when the exposed area 150*us*_2 of the upper surface of the second electrode support 150 does not extend up to the first boundary lines 150*sb* and/or the second boundary lines 150*sa* unlike in FIG. 2, the support connection pattern 250 may not laterally protrude further than the sidewalls of the second electrode support 150.

The support connection pattern 250 may include a conductive material, for example, at least one of a semiconductor material doped with impurities, a conductive silicide compound, a conductive metal nitride, a conductive metal oxide, and/or a metal.

A second interlayer insulating film 260 may be on the upper plate electrode 240. The second interlayer insulating film 260 may cover both an upper surface of the support connection pattern 250 and sidewalls of the support connection pattern 250.

The first ground plug 270 may be in the second interlayer insulating film 260 and connected to the upper plate electrode 240. The first ground plug 270 may fill a first ground plug hole 270*h* in the second interlayer insulating film 260.

The first ground plug 270 may be electrically connected to the upper plate electrode 240, the support connection pattern 250, the upper electrode 230, and the second electrode support 150. The first ground plug 270 may be electrically connected to the second electrode support 150 via the upper plate electrode 240 and the support connection pattern 250. The first ground plug 270 may be electrically connected to the second electrode support 150 through the exposed area 150*us*_2 of the upper surface of the second electrode support 150.

The first ground plug 270 may be connected to a specific voltage, for example, a ground voltage. The upper plate electrode 240, the support connection pattern 250, the upper electrode 230, and the second electrode support 150 may be connected to the ground voltage. The first ground plug 270 may include a conductor, for example, at least one of a semiconductor material doped with impurities, a conductive silicide compound, a conductive metal nitride, a conductive metal oxide, and a metal.

As a distance between the lower electrodes 210 decreases, a leakage current may be generated between adjacent lower electrodes 210. The leakage current generated between adjacent lower electrodes 210 may reduce the reliability and performance of the semiconductor device.

However, since the second electrode support 150 includes a conductive material and is connected to the ground voltage, the leakage current between the adjacent lower electrodes 210 can be prevented, thereby improving the reliability and performance of the semiconductor device. Further, since the second electrode support 150 is electrically connected to the upper electrode 230, each insulating spacer 160 between the second electrode support 150 and a lower electrode 210 may serve as a dielectric layer of a capacitor, thereby increasing the capacitance of the capacitor of the semiconductor device.

Figure 6:
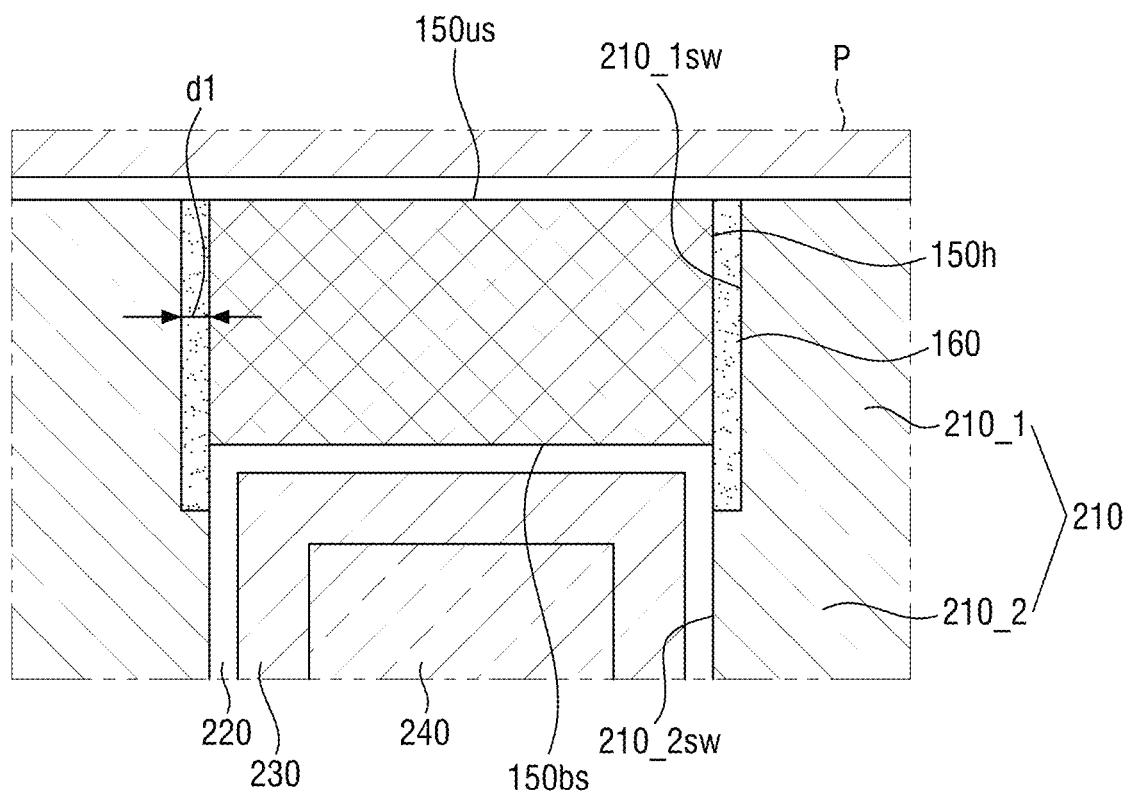
FIGS. 6 and 7 respectively illustrate semiconductor devices according to at least one example embodiment of the present inventive concepts.
Figure 7:
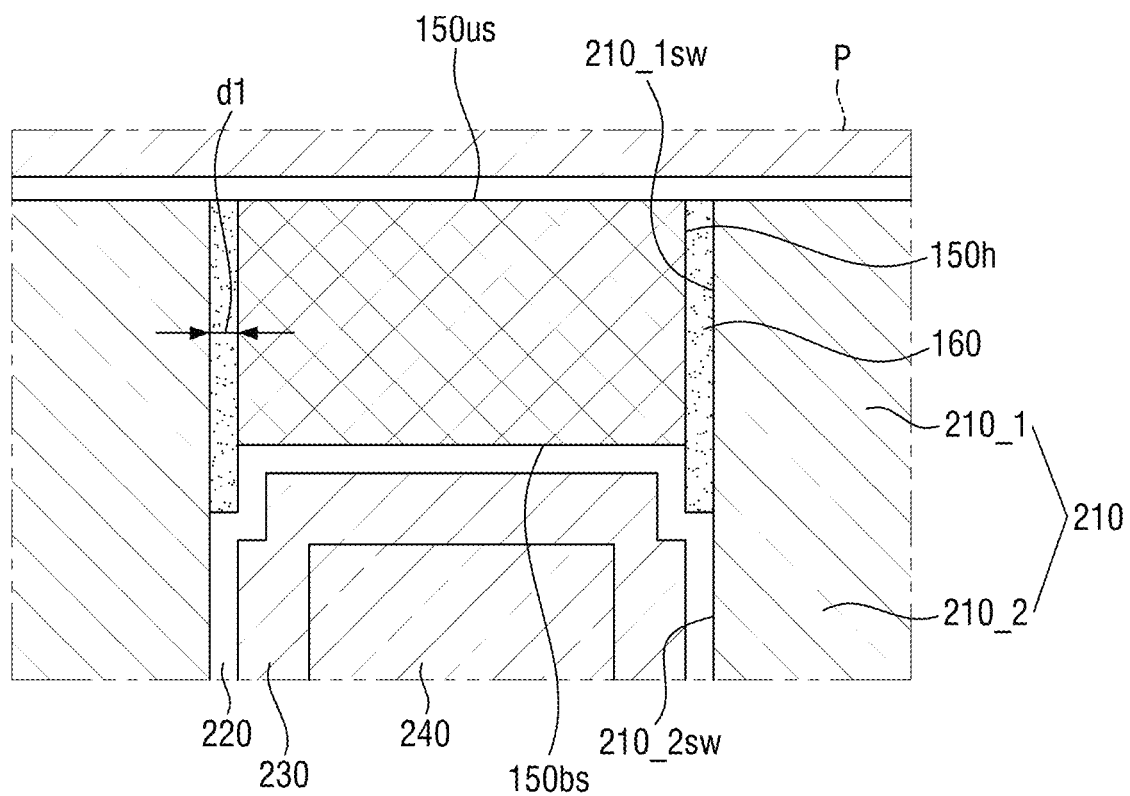
Figure 8:
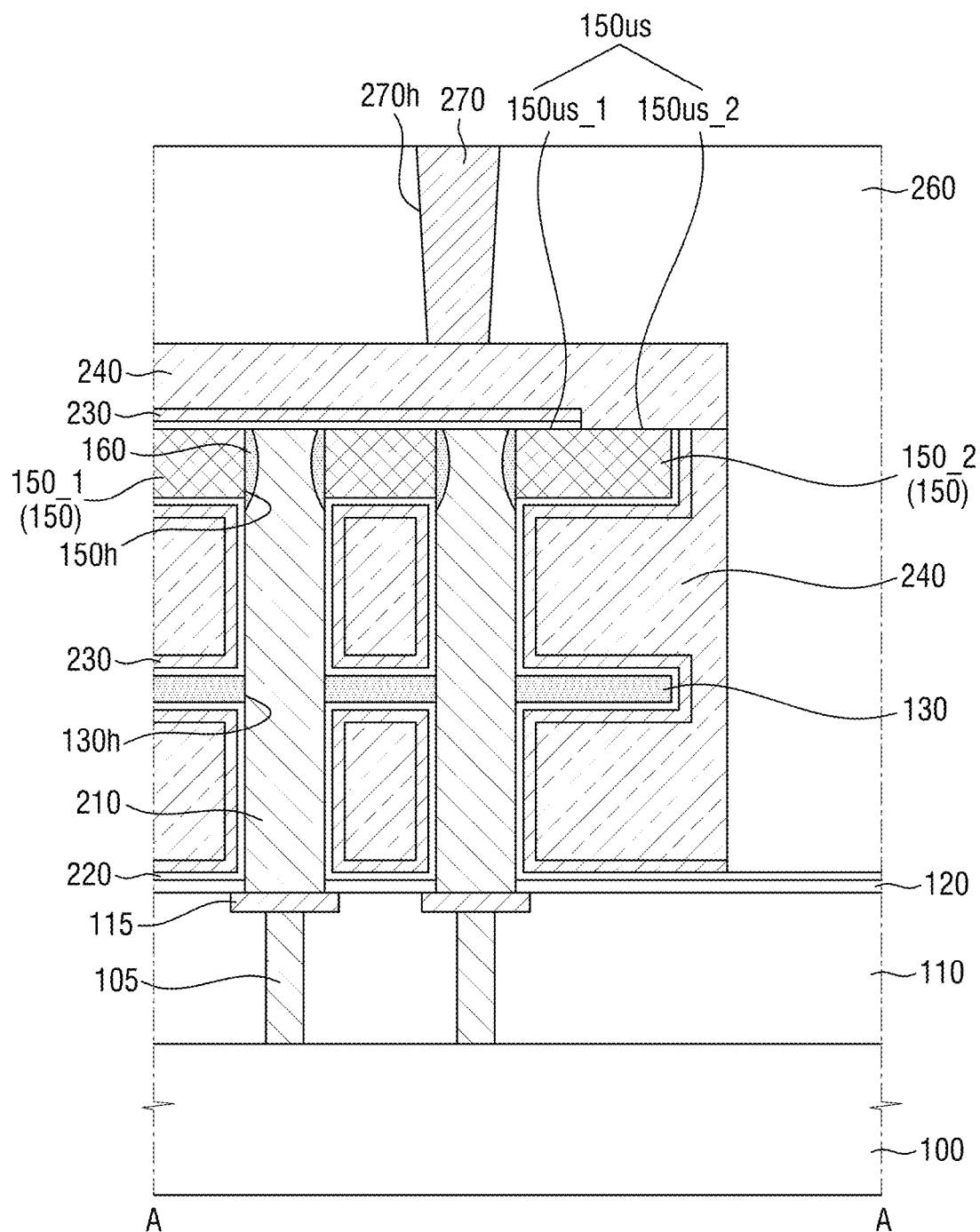
FIG. 8 illustrates a semiconductor device according at least one example embodiment of the present inventive concepts.

FIGS. 6 and 7 respectively illustrate semiconductor devices according to at least one example embodiment of the present inventive concepts. FIG. 8 illustrates a semiconductor device according to at least one example embodiment of the present inventive concepts. For ease of description, identical reference numerals are used for the same constituent elements in the drawings, and a duplicate description thereof will may be omitted, and differences from the semiconductor device described above with reference to FIGS. 1 through 5 will be mainly described.

Referring to FIGS. 6 and 7, in the semiconductor devices according to the embodiments, a thickness d1 of each insulating spacer 160 may be constant as a distance from a substrate 100 increases.

In FIG. 6, each insulating spacer 160 may be mounted on a non-overlap area 210_2 of a lower electrode 210. In FIG. 7, each insulating spacer 160 may be mounted on a capacitor dielectric layer 220 and an upper electrode 230 between a second electrode support 150 and a first electrode support 130.

Referring to FIG. 8, in the semiconductor device according to an example embodiment, an upper plate electrode 240 may be on an exposed area 150*us*_2 of an upper surface 150*us* of a second electrode support 150.

The upper plate electrode 240 may cover the exposed area 150*us*_2 of the upper surface 150*us* of the second electrode support 150. A first ground plug 270 may be electrically connected to the second electrode support 150 via the upper plate electrode 240.

Figure 9:
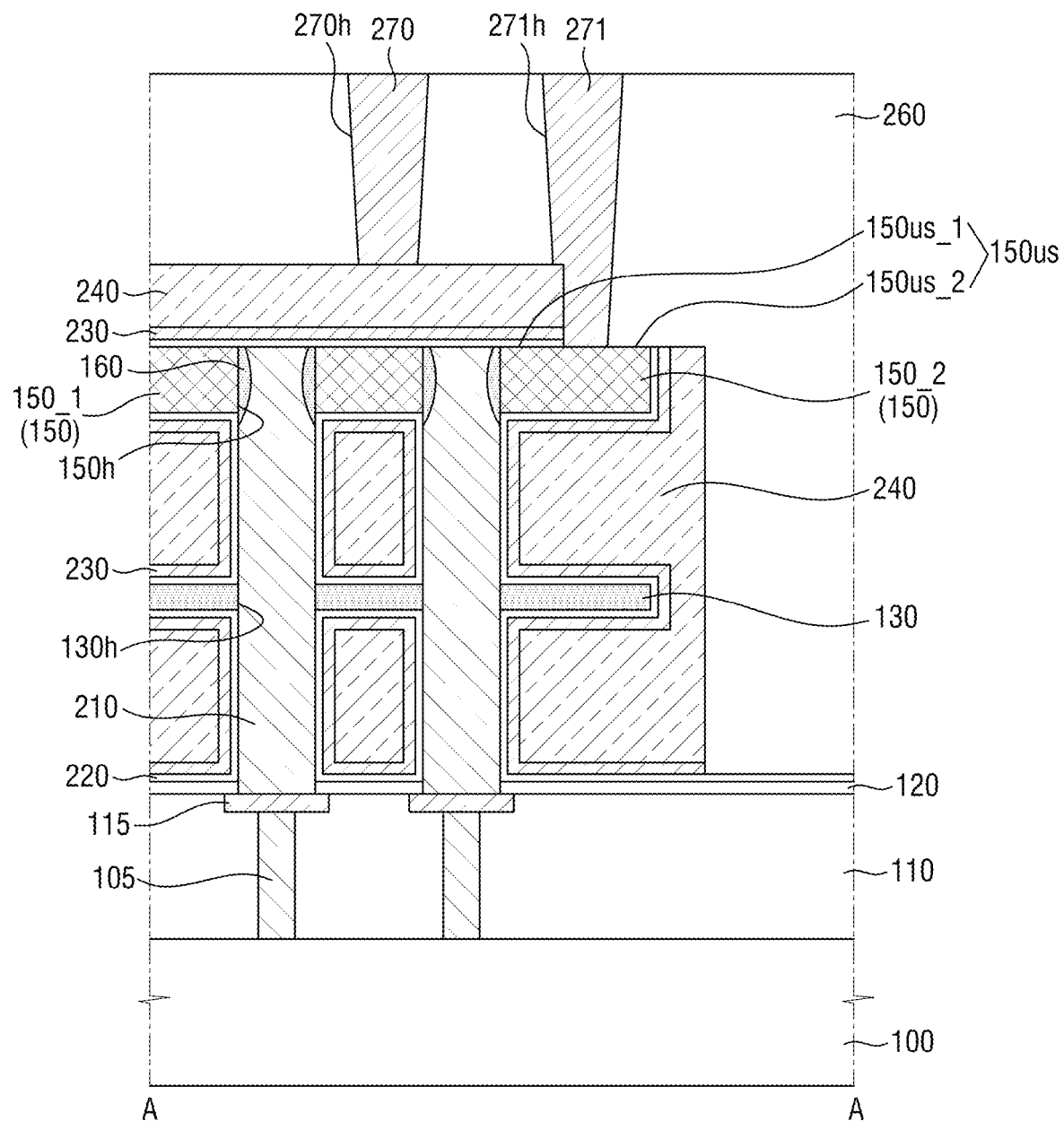
FIGS. 9 through 11 respectively illustrate semiconductor devices according to at least one example embodiment of the present inventive concepts.
Figure 10:
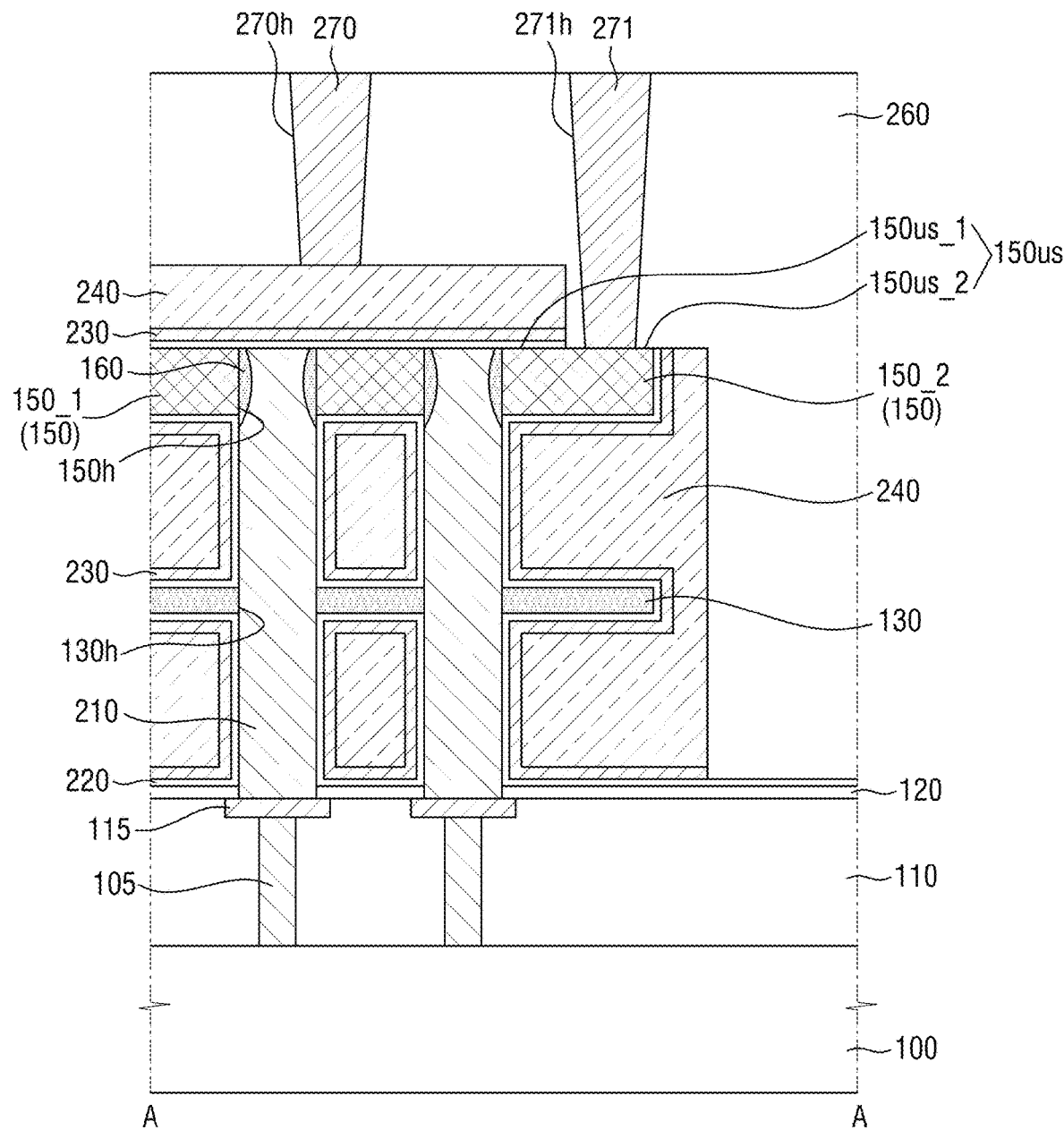
Figure 11:
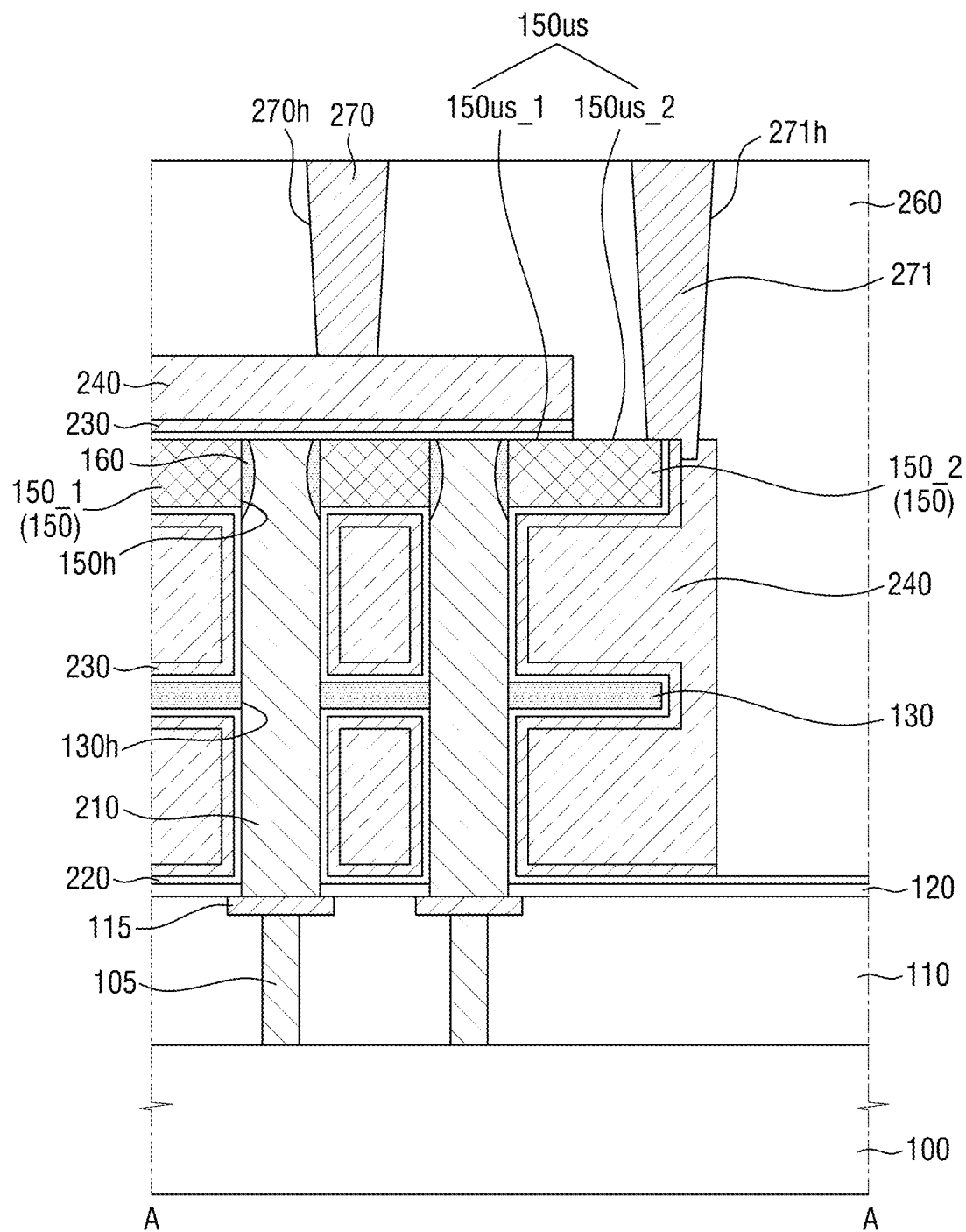

FIGS. 9 through 11 respectively illustrate semiconductor devices according to at least one example embodiment of the present inventive concepts. For ease of description, identical reference numerals are used for the same constituent elements in the drawings, and a duplicate description thereof will may be omitted, and differences from the semiconductor device described above with reference to FIGS. 1 through 5 will be mainly described.

Referring to FIGS. 9 through 11, each of the semiconductor devices according to the embodiments may further include a second ground plug 271 directly connected to an exposed area 150*us*_2 of an upper surface 150*us* of a second electrode support 150.

The second ground plug 271 may fill a second ground plug hole 271*h* in a second interlayer insulating film 260. The second ground plug 271 may be directly connected to the second electrode support 150. The second ground plug 271 may be electrically connected to the second electrode support 150 without connecting through the upper plate electrode 240. The second ground plug 271 may be connected to, for example, a ground voltage.

In FIG. 9, a part of the second ground plug 271 may be on the exposed area 150*us*_2 of the upper surface 150*us* of the second electrode support 150, and the other part of the second ground plug 271 may be on an unexposed area 150us_1 of the upper surface 150us of the second electrode support 150. A part of the second ground plug 271 may sit on the upper plate electrode 240. Alternatively, the second ground plug 271 may completely and/or partially penetrate the upper plate electrode 240, the upper electrode 230, and/or the capacitor dielectric layer 220 over the unexposed area 150us_1 of the upper surface 150us of the second electrode support 150.

In FIG. 10, the second ground plug 271 may be on the exposed area 150us_2 of the upper surface 150us of the second electrode support 150. The entire bottom surface of the second ground plug 271 may be located on the exposed area 150us_2 of the upper surface 150us of the second electrode support 150.

In FIG. 11, a part of the second ground plug 271 may be on the exposed area 150us_2 of the upper surface 150us of the second electrode support 150, and the other part of the second ground plug 271 may not be on the upper surface 150us of the second electrode support 150. The part of the second ground plug 271 not on the upper surface 150us of the second electrode support 150 may extend past the upper surface 150us, in the thickness direction, towards the substrate, and partially contact the sidewall of the second electrode support 150. A part of the second ground plug 271 may sit on the second electrode support 150.

In FIGS. 9 and 11, a first ground plug 270 is on the upper plate electrode 240. However, embodiments are not limited to this case. For example, semiconductor device may include only the second ground plug 271, without the first ground plug 270.

Figure 12:
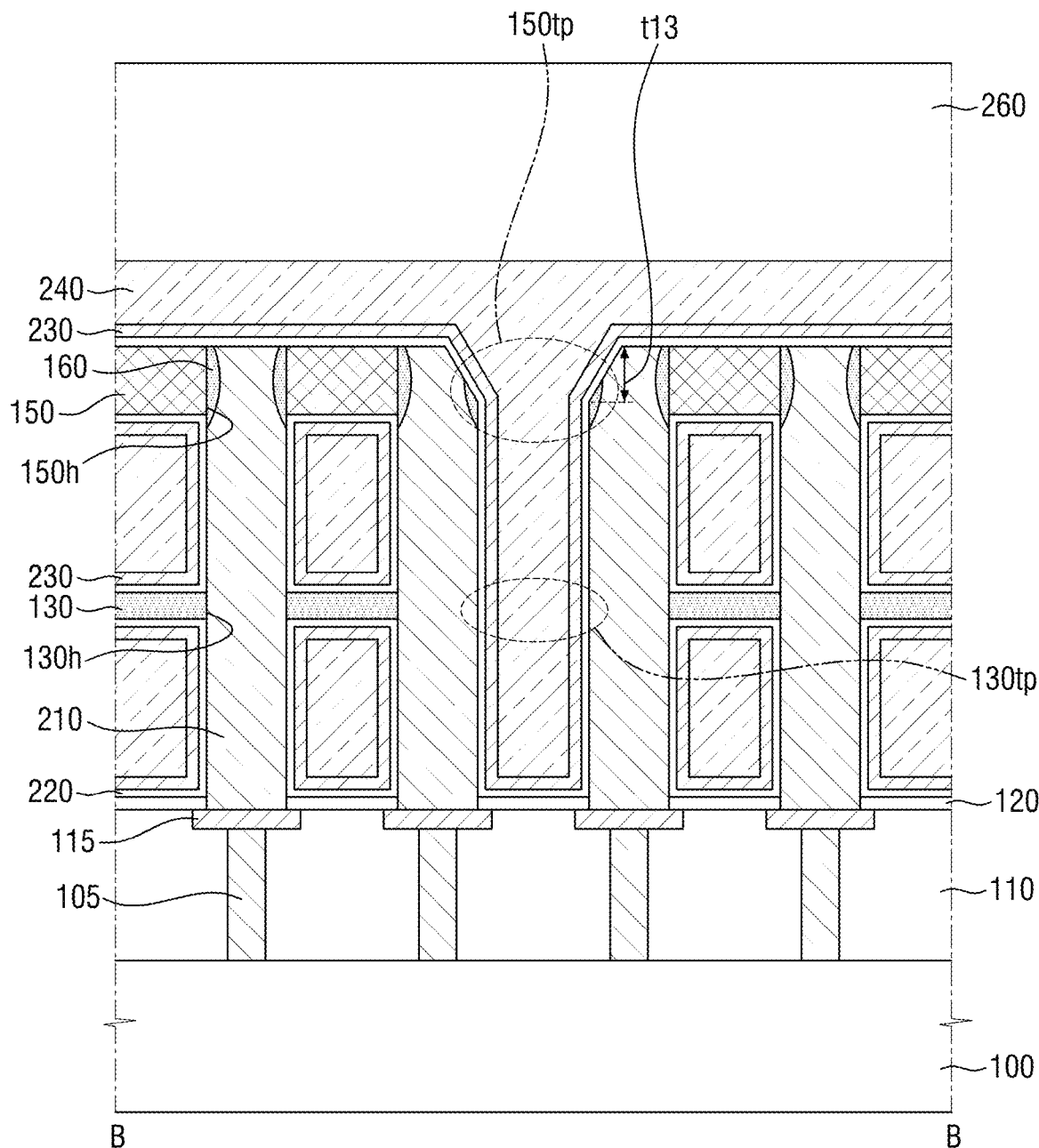
FIG. 12 illustrates a semiconductor device according to at least one example embodiment of the present inventive concepts.
Figure 13:
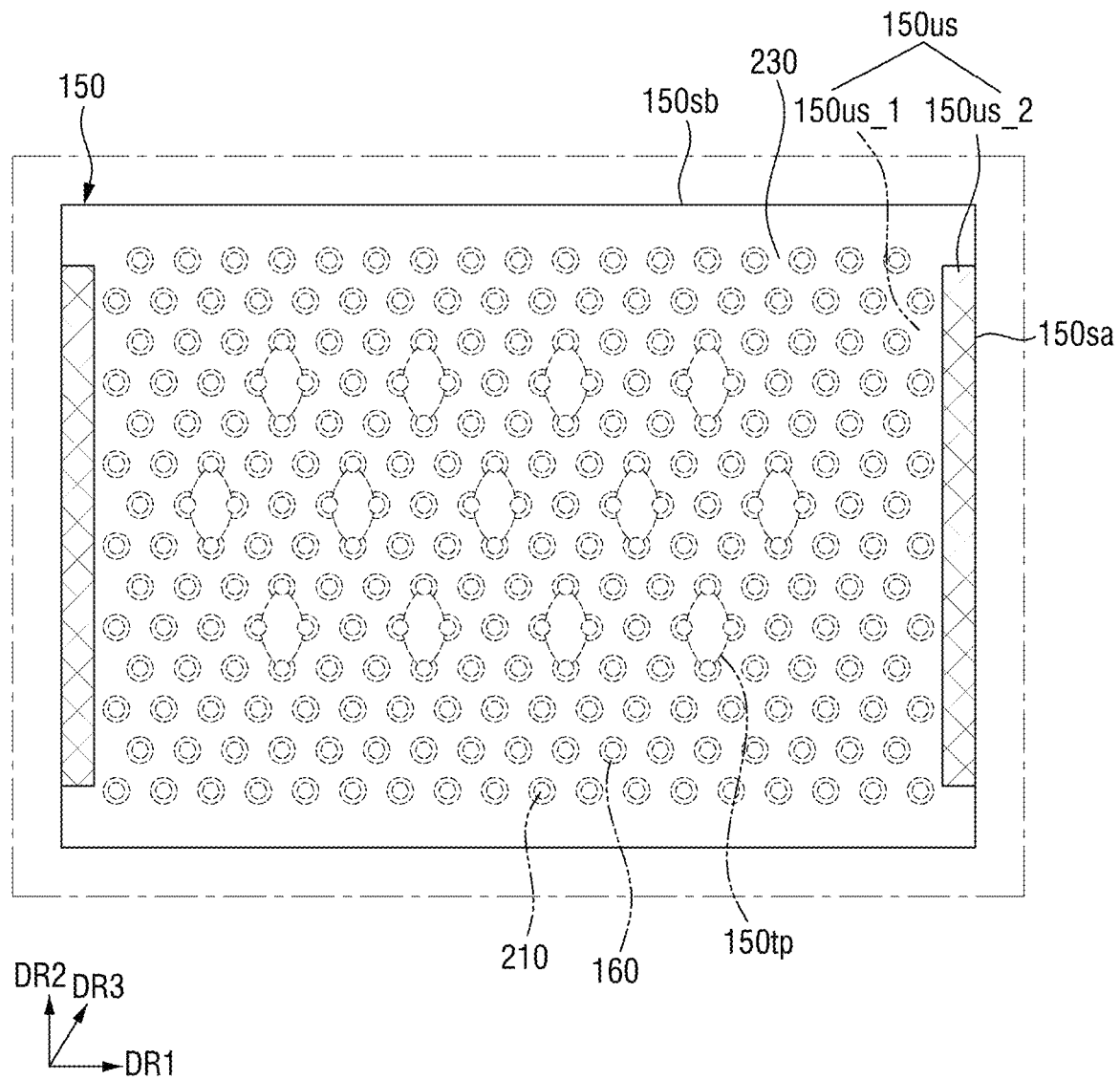
FIG. 13 illustrates a semiconductor device according to at least one example embodiment of the present inventive concepts.
Figure 14:
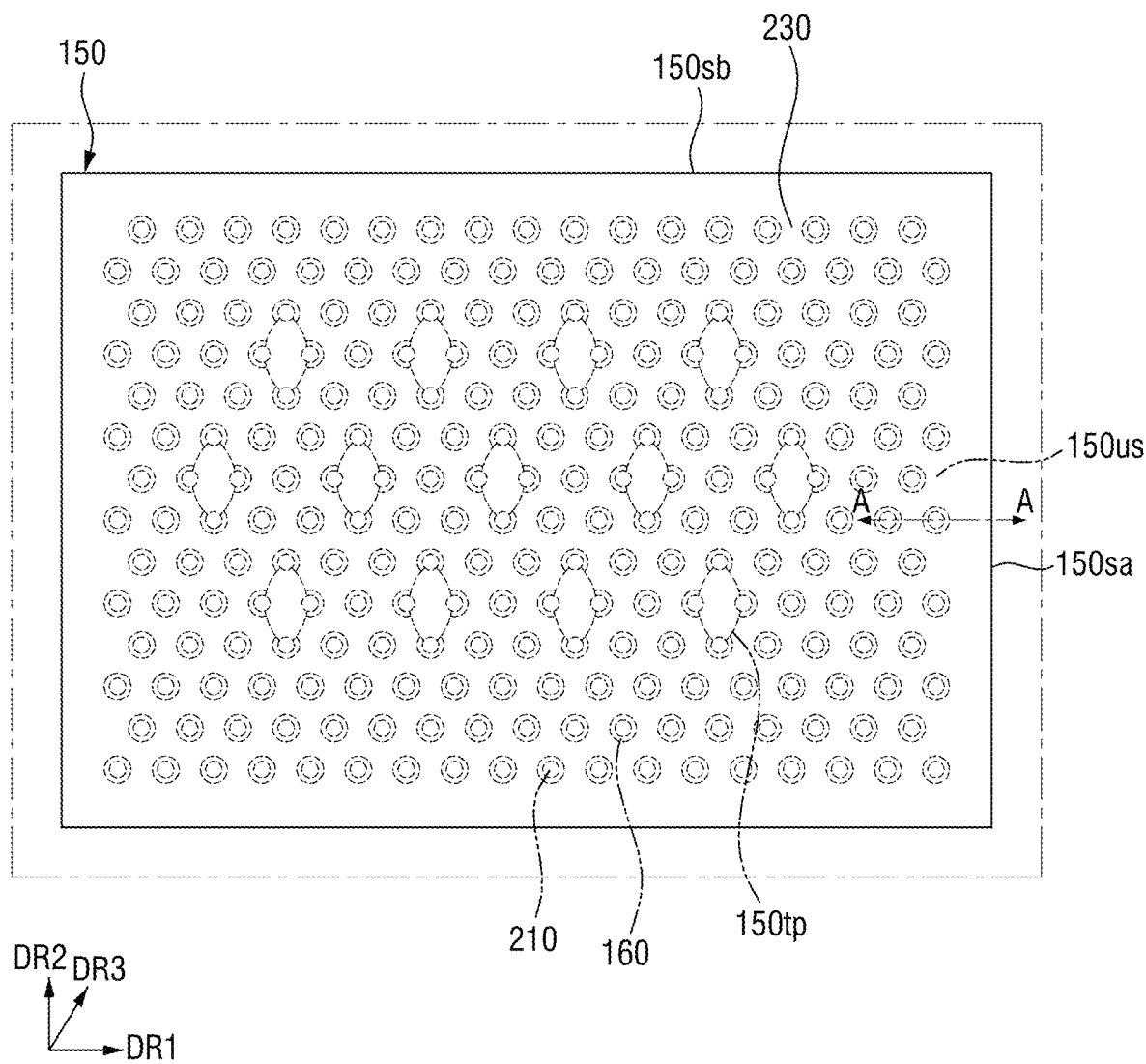
FIGS. 14 and 15 illustrate a semiconductor device according to at least one example embodiment of the present inventive concepts.
Figure 15:
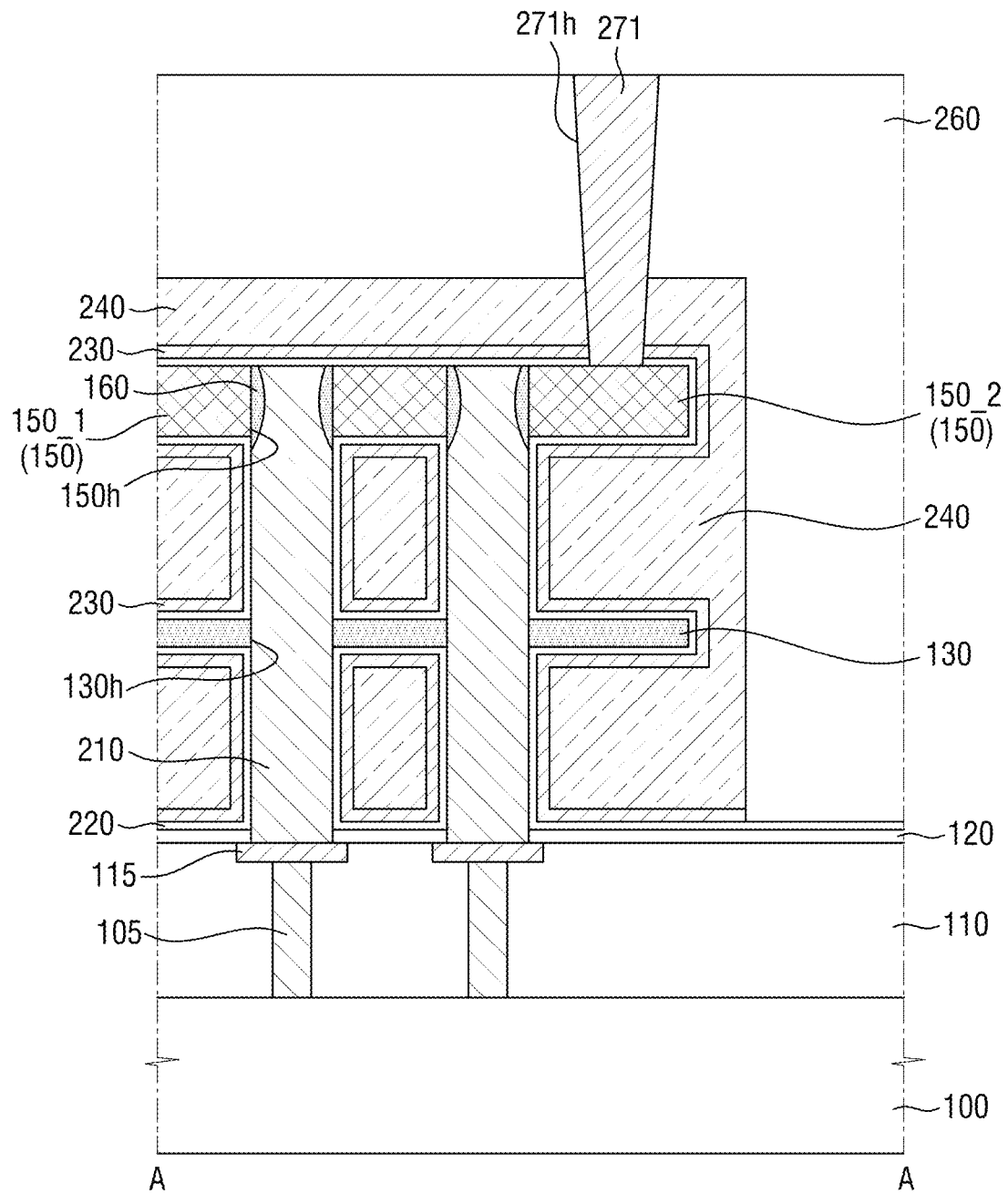
Figure 16:
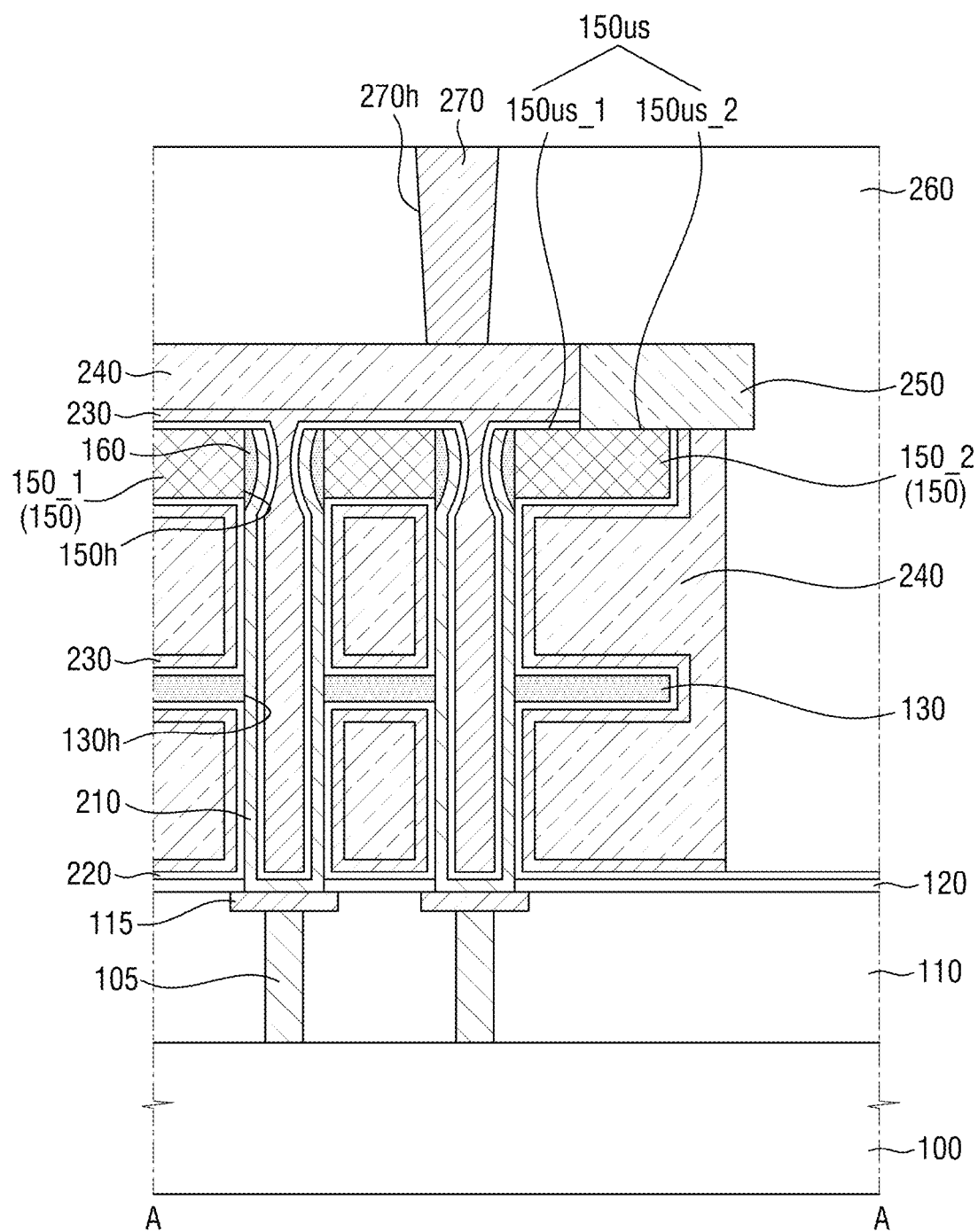
FIG. 16 illustrates a semiconductor device according to at least one example embodiment of the present inventive concepts.

FIG. 12 illustrates a semiconductor device according to at least one example embodiment of the present inventive concepts. FIG. 13 illustrates a semiconductor device according to at least one example embodiment of the present inventive concepts. FIGS. 14 and 15 illustrate a semiconductor device according to at least one example embodiment of the present inventive concepts. FIG. 16 illustrates a semiconductor device according to at least one example embodiment of the present inventive concepts. For ease of description, identical reference numerals are used for the same constituent elements in the drawings, and a duplicate description thereof will may be omitted, and differences from the semiconductor device described above with reference to FIGS. 1 through 5 will be mainly described. For reference, each of FIGS. 13 and 14 is an example plan view of an upper electrode 230 on lower electrodes 210 and a second electrode support 150.

Referring to FIG. 12, in the semiconductor device according to the example embodiment, a height t13 of a chamfered part of a lower electrode 210 may be greater than a distance t14 (see FIG. 5) from an upper surface 150us of a second electrode support 150 to a bottom of each insulating spacer 160. In a part where a second through pattern 150tp is formed, the insulating spacers 160 may be on sidewalls of lower electrodes 210 that meet the second through pattern 150tp. The insulating spacers 160 may be on the sidewalls of the lower electrodes 210 in the part overlapping the second through pattern 150tp.

Referring to FIG. 13, in the semiconductor device according to the example embodiment, an exposed area 150us_2 of an upper surface 150us of a second electrode support 150 may be along second boundary lines 150sa of the second electrode support 150. However, the exposed area 150us_2 of the upper surface 150us of the second electrode support 150 is not along first boundary lines 150sb of the second electrode support 150.

The exposed area 150us_2 of the upper surface 150us of the second electrode support 150 may be defined along the first boundary lines 150sb of the second electrode support 150 or the second boundary lines 150sa of the second electrode support 150 that extend in a different direction from the first boundary lines 150sb.

Referring to FIGS. 14 and 15, the semiconductor device according to the example embodiment may further include a second ground plug 271 connected to an edge part 150_2 of a second electrode support 150 in an upper surface 150us of the second electrode support 150.

The second ground plug 271 may fill a second ground plug hole 271h in a second interlayer insulating film 260. The upper surface 150us of the second electrode support 150 does not include a rectangular exposed area extending along first boundary lines 150sb of the second electrode support 150 and second boundary lines 150sa of the second electrode support 150.

Although only the second ground plug 271 is illustrated in FIG. 15, embodiments are not limited to this case. A first ground plug 270 (see FIG. 3) connected to an upper plate electrode 240 may be further included in the semiconductor device.

Referring to FIG. 16, in the semiconductor device according to the embodiments, each lower electrode 210 may be shaped like a cylinder.

Each lower electrode 210 may include a bottom part extending along an upper surface of a first landing pad 115 and a sidewall part extending in a thickness direction of a substrate 100 from the bottom part. The upper electrode 230 may extend in the thickness direction, filling an inner gap inside the sidewall part of the lower electrode 210. A capacitor dielectric layer 220 may be between the upper electrode 230 and the lower electrode 210. The thickness of the upper electrode 230 in an area overlapping the second electrode support 150 may be less than a thickness of the upper electrode 230 at an area overlapping the first electrode support 130.

Figure 17:
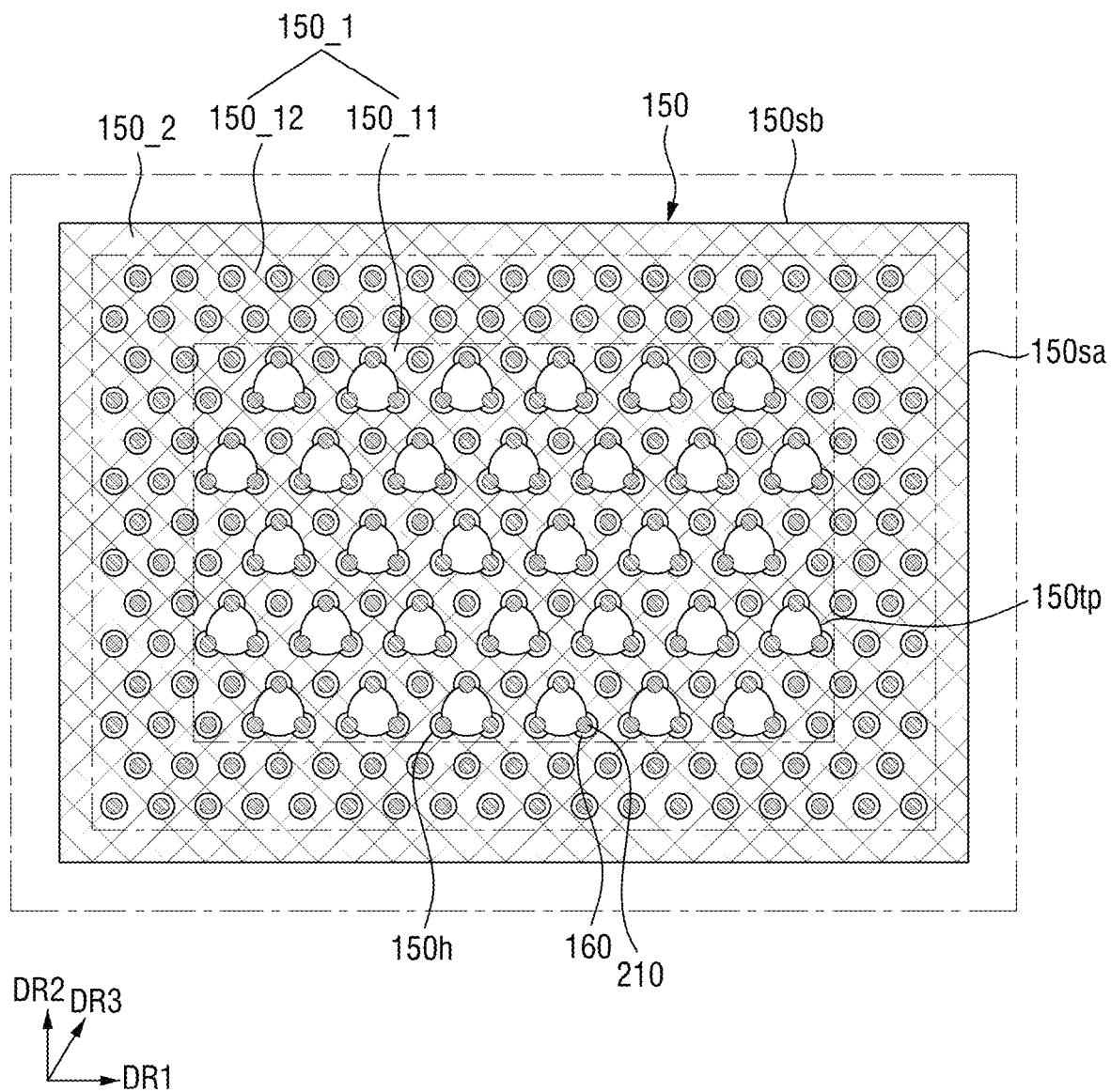
FIGS. 17 through 19 respectively illustrate semiconductor devices according to at least one example embodiment of the present inventive concepts.
Figure 18:
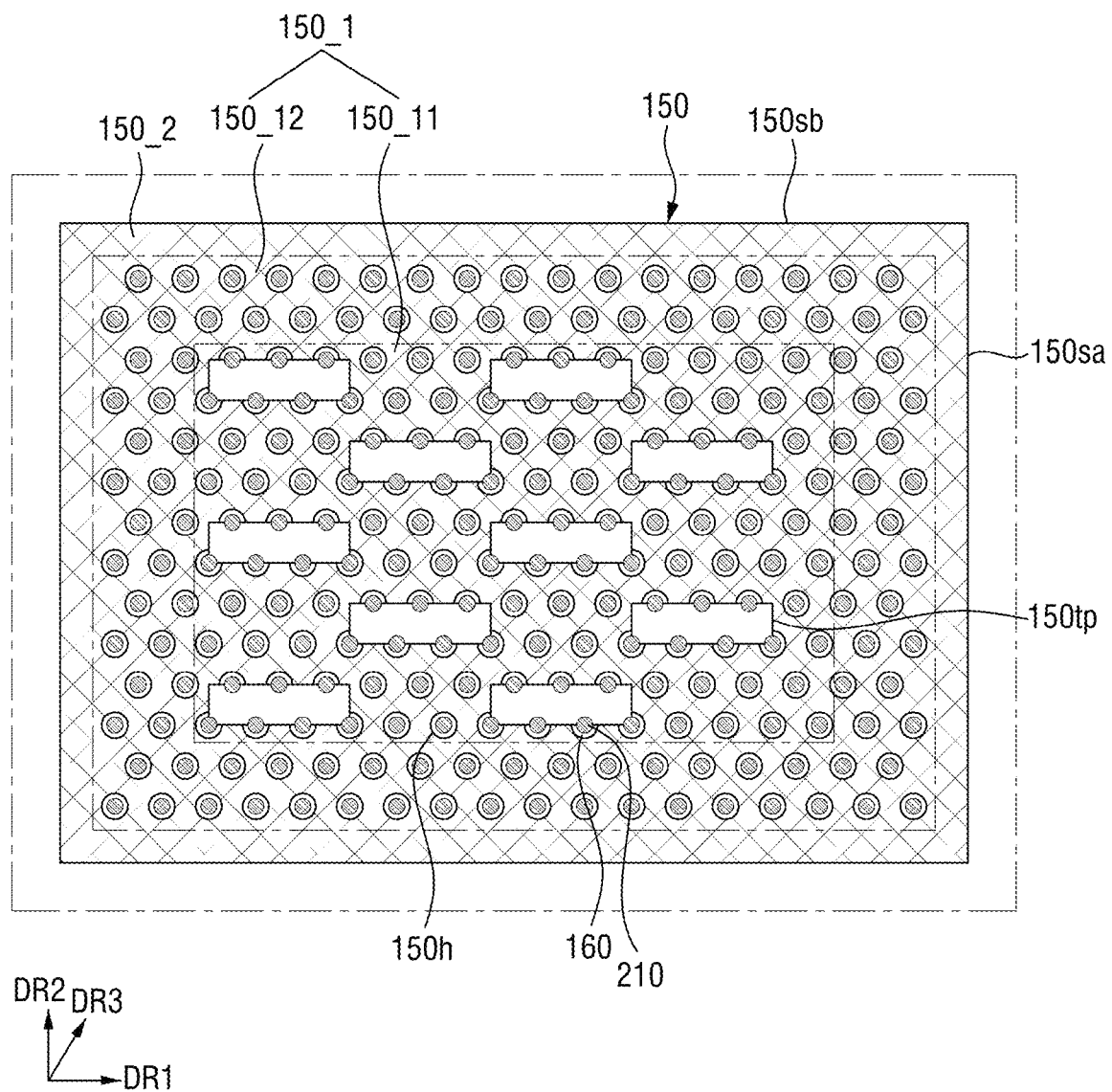
Figure 19:
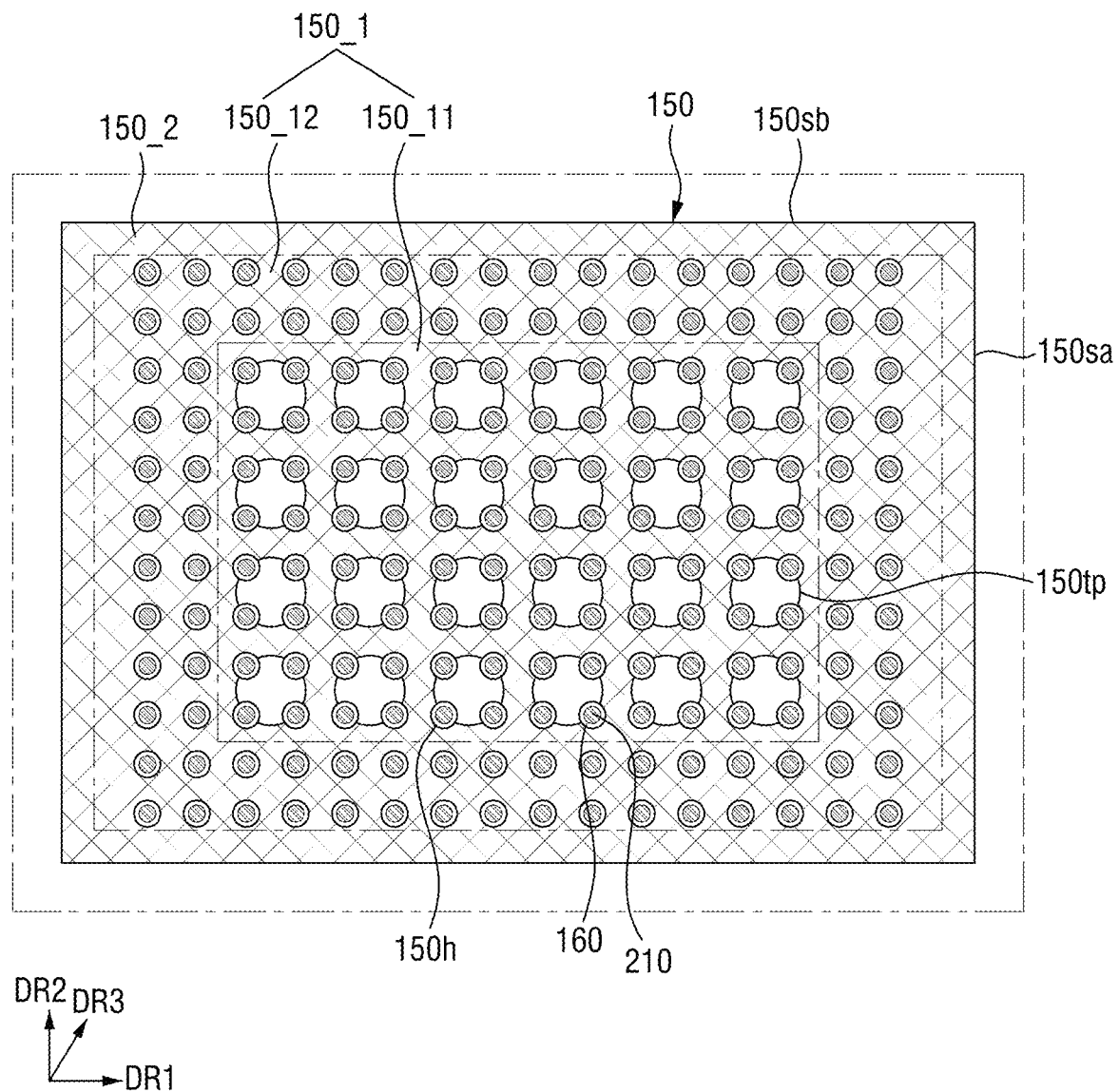

FIGS. 17 through 19 respectively illustrate semiconductor devices according to at least one example embodiment of the present inventive concepts. For ease of description, identical reference numerals are used for the same constituent elements in the drawings, and a duplicate description thereof will may be omitted, and differences from the semiconductor device described above with reference to FIGS. 1 through 5 will be mainly described. For reference, each of FIGS. 17 through 19 is a plan view of lower electrodes 210 and a second electrode support 150 of a semiconductor device.

Referring to FIG. 17, in a semiconductor device according to at least one example embodiment of the present inventive concepts, each second through pattern 150tp may be formed between three adjacent lower electrodes 210.

Three lower electrodes 210 meeting one second through pattern 150tp may be located at vertices of a triangle or a trianguloid.

A first through pattern 130tp (see FIG. 4) included in a first electrode support 130 may be at a position corresponding to each second through pattern 150tp and may have a shape corresponding to that of each second through pattern 150tp.

Referring to FIG. 18, in a semiconductor device according to at least one example embodiment of the present inventive concepts, each second through pattern 150tp may be shaped like a bar extending in a first direction DR1.

Each second through pattern 150t may be formed over three lower electrodes 210 adjacent to each other in the first direction DR1 and four lower electrodes 210 adjacent to each other in the first direction DR1. However, this is merely an example used for ease of description, and embodiments are not limited to this example. For example, the quantity of lower electrodes 210 may be more or less than depicted.

Referring to FIG. 19, in a semiconductor device according to at least one example embodiment of the present inventive concepts, lower electrodes 210 repeatedly aligned in a second direction DR2 may be linearly arranged along the second direction DR2.

The lower electrodes 210 repeatedly aligned in a first direction DR1 may be arranged along the first direction DR1. In addition, the lower electrodes 210 repeatedly aligned in the second direction DR2 may be arranged along the second direction DR2.

Figure 20:
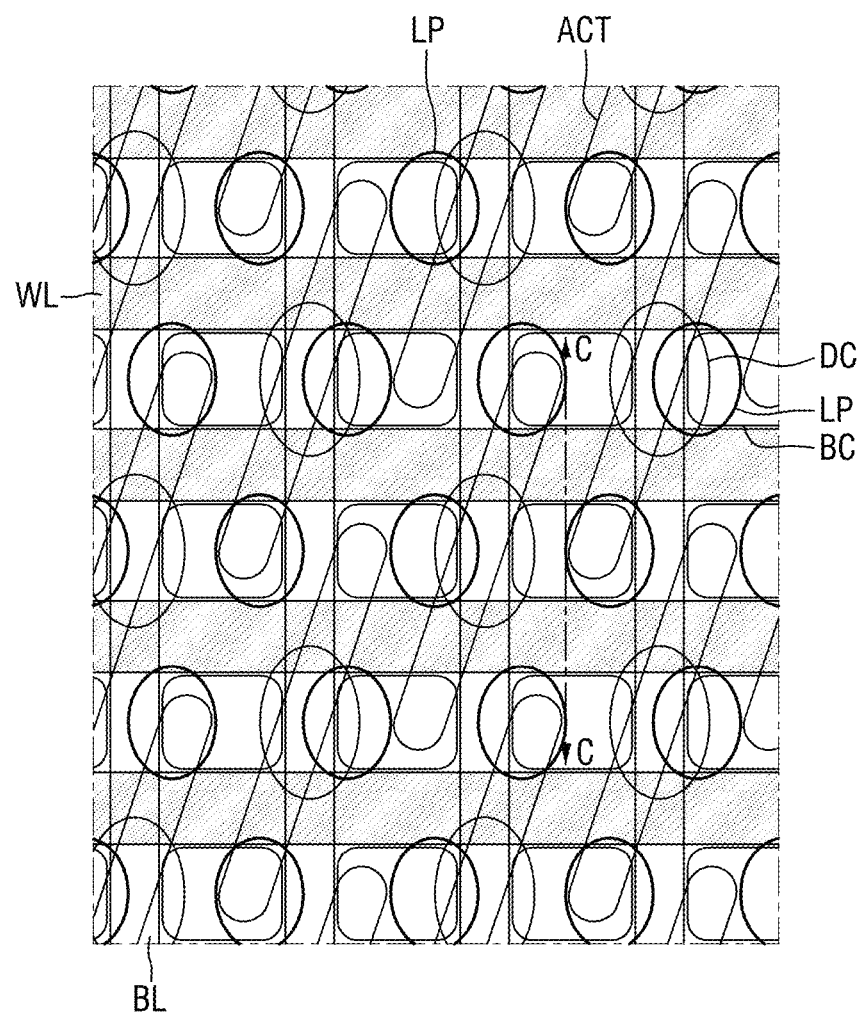
FIGS. 20 and 21 illustrate a semiconductor device according to at least one example embodiment of the present inventive concepts.
Figure 21:
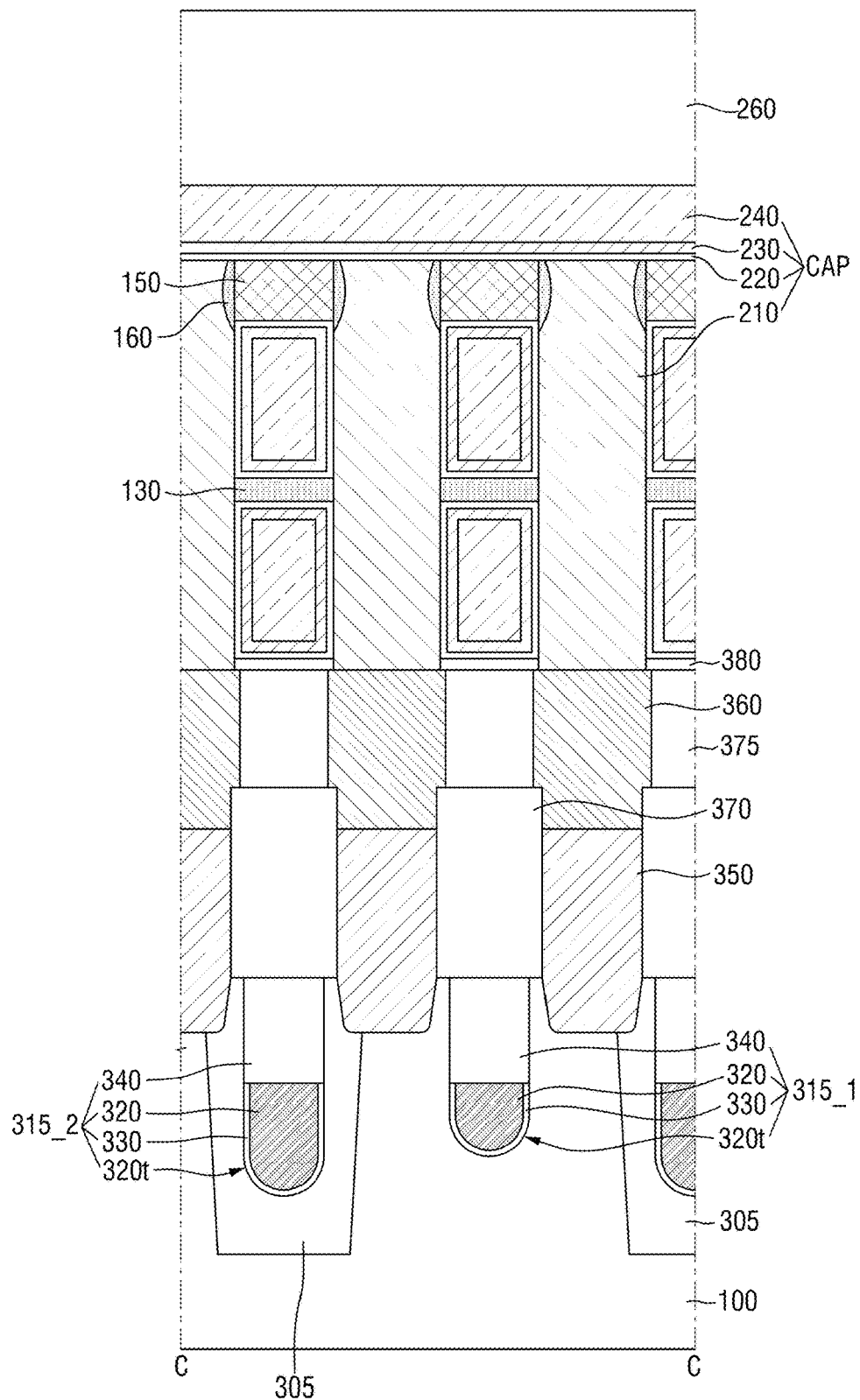

FIGS. 20 and 21 illustrate a semiconductor device according to at least one example embodiment of the present inventive concepts. For reference, FIG. 21 is a cross-sectional view taken along C-C of FIG. 20.

Although FIG. 20 illustrates an example layout view of a DRAM excluding a capacitor CAP, embodiments are not limited to this case. A first direction DR1 and a second direction DR2 of FIG. 20 may be the first direction DR1 and the second direction DR2 of FIG. 1. However, embodiments are not limited to this case, and the first direction DR1 of FIG. 20 may also correspond to the second direction DR2 of FIG. 1, and the second direction DR2 of FIG. 20 may also correspond to the first direction DR1 of FIG. 1.

Referring to FIG. 20, the semiconductor device according to the example embodiment may include a plurality of active areas ACT. The active areas ACT may be defined by an element isolation layer 305 (see FIG. 21) formed in a substrate 100 (see FIG. 21).

As design rules of the semiconductor device are reduced, the active areas ACT may be in the shape of diagonal or oblique bars as illustrated in the drawing. The active areas ACT may be shaped like bars extending in a fourth direction DR4.

A plurality of gate electrodes may be on the active areas ACT to cross the active areas ACT in the first direction DR1. The gate electrodes may extend parallel to each other. The gate electrodes may be, for example, a plurality of word lines WL. The word lines WL may be at regular intervals. A width of each word line WL or a gap between the word lines WL may be determined according to the design rules. A plurality of bit lines BL may be on the word lines WL to extend in the second direction DR2 orthogonal to the word lines WL. The bit lines BL may extend parallel to each other. The bit lines BL may be at regular intervals. A width of each bit line BL or a gap between the bit lines BL may be determined according to the design rules.

The semiconductor device according to the embodiments may include various contact arrays formed on the active areas ACT. The various contact arrays may include, for example, direct contacts DC, buried contacts BC, and landing pads LP. Here, the direct contacts DC may be contacts that electrically connect the active areas ACT to the bit lines BL. The buried contacts BC may be contacts that connect the active areas ACT to lower electrodes 210 (see FIG. 21) of the capacitor CAP (see FIG. 21).

In the arrangement structure, a contact area between each buried contact BC and a corresponding active area ACT may be small. Accordingly, a conductive second landing pad LP may be introduced to increase the contact area with the corresponding active area ACT and a contact area with a corresponding lower electrode 210 (see FIG. 21) of the capacitor CAP. The second landing pad LP may be between each buried contact BC and the corresponding active area ACT or between each buried contact BC and the corresponding lower electrode 210 of the capacitor CAP. In the semiconductor device according to the embodiments, the second landing pad LP may be between each buried contact BC and the corresponding lower electrode 210 of the capacitor CAP. The contact area increased by the introduction of the second landing pad LP may reduce the contact resistance between each active area ACT and a corresponding lower electrode 210 of the capacitor CAP.

In the semiconductor device according to the embodiments, each direct contact DC may be in a central part of a corresponding active area ACT. The buried contacts BC may be at both ends of each active area ACT. Since the buried contacts BC are at both ends of each active area ACT, the second landing pads LP may be adjacent to both ends of each active area ACT to partially overlap the buried contacts BC. For example, each buried contact BC may be formed to overlap an active area ACT and the element isolation layer 305 (see FIG. 21) located between adjacent word lines WL and between adjacent bit lines BL.

The word lines WL may be buried in the substrate 100. The word lines WL may cross the active areas ACT between the direct contacts DC or the buried contacts BC.

As illustrated in the drawing, two word lines WL may cross one active area ACT. Since the active areas ACT are obliquely, the word lines WL may be at an angle of less than 90 degrees to the active areas ACT.

The direct contacts DC and the buried contacts BC may be symmetrically. Therefore, the direct contacts DC and the buried contacts BC may lie on a straight line along the first direction DR1 and the second direction DR4. Unlike the direct contacts DC and the buried contacts BC, the second landing pads LP may be in a zigzag pattern in the second direction DR2 in which the bit lines BL extend. In addition, the second landing pads LP may be to overlap the same side of each bit line BL in the first direction DR1 in which the word lines WL extend. For example, each second landing pad LP in a first line may overlap a left side of a corresponding bit line BL and each second landing pad LP of a second line may overlap a right side of the corresponding bit line BL.

Referring to FIGS. 20 and 21, the semiconductor device according to the example embodiment may include gate structures 315_1 and 315_2, second storage contacts 350, and the capacitor CAP.

The element isolation layer 305 may be formed in the substrate 100. The element isolation layer 305 may have a shallow trench isolation (STI) structure with element isolation characteristics. The element isolation layer 305 may define the active areas ACT on the substrate 100.

The gate structures 315_1 and 315_2 may be formed in the substrate 100 and the element isolation layer 305. The gate structures 315_1 and 315_2 may be formed to cross the element isolation layer 305 and the active areas ACT defined by the element isolation layer 305. The gate structures 315_1 and 315_2 include gate structures 315_1 in the active areas ACT of the substrate 100 and gate structures 315_2 in the element isolation layer 305. Each of the gate structures 315_1 and 315_2 may include a buried gate trench 320t formed in the substrate 100 or the element isolation layer 305, a gate insulating layer 330, a gate electrode 320, and a gate block pattern 340. The gate electrode 320 may correspond to each of the word lines WL. For example, a depth of the buried gate trench 320t formed in the substrate 100 may be different from that of the buried gate trench 320t formed in the element isolation layer 305.

The gate insulating layer 330 may extend along sidewalls and a bottom surface of the buried gate trench 320t. The gate insulating layer 330 may extend along the profile of at least a part of the buried gate trench 320t. The gate insulating layer 330 may include, for example, at least one of silicon oxide, silicon oxynitride, silicon nitride, and a high-k material containing a metal.

The gate electrode 320 may be formed on the gate insulating layer 330. The gate electrode 320 may fill a part of the buried gate trench 320t.

The gate electrode 320 may include, for example, at least one of a semiconductor material doped with impurities, a conductive silicide compound, a conductive metal nitride, a conductive metal oxide, a conductive metal oxynitride, and/or a metal.

The gate block pattern 340 may be formed on the gate electrode 320. The gate block pattern 340 may fill the buried gate trench 320t remaining after the gate electrode 320 is formed. The gate block pattern 340 may include an insulator, for example, at least one of silicon nitride, silicon oxynitride, silicon oxide, silicon carbonitride, silicon oxycarbonitride, and/or combinations of the same.

A third lower interlayer insulating film 370 may be on the substrate 100 and the element isolation layer 305. The third lower interlayer insulating film 370 may cover the gate structures 315_1 and 315_2.

The second storage contacts 350 may be formed in the third lower interlayer insulating film 370. The second storage contacts 350 may be connected to the substrate 100. More specifically, the second storage contacts 350 may be connected to source/drain regions formed in the active areas ACT of the substrate 100. A second storage contact 350 may be on at least one side of each of the gate structures 315_1 and 315_2. For example, the second storage contacts 350 may respectively be on both sides of each of the gate structures 315_1 and 315_2. The second storage contacts 350 may correspond to the buried contacts BC, and may act as contact plugs for the source/drain regions. In addition, the second storage contacts 350 may correspond to the first storage contacts 105 of FIGS. 3 and 4.

Storage pads 360 may be formed on the second storage contacts 350. The storage pads 360 may be electrically connected to the second storage contacts 350. Here, the storage pads 360 may correspond to the second landing pads LP. In addition, the storage pads 360 may correspond to the first landing pads 115 of FIGS. 3 and 4.

A third upper interlayer insulating film 375 may be formed on the third lower interlayer insulating film 370. The third upper interlayer insulating film 375 may cover the storage pads 360. The third upper interlayer insulating film 375 and the third lower interlayer insulating film 370 may correspond to the first interlayer insulating film 110 of FIGS. 3 and 4. A second etch stop layer 380 may be formed on the third upper interlayer insulating film 375 and the storage pads 360. The second etch stop layer 380 may correspond to the first etch stop layer 120 of FIGS. 3 and 4.

The capacitor CAP may be on the storage pads 360. The capacitor CAP may be connected to the storage pads 360. The capacitor CAP may be electrically connected to the second storage contacts 350.

The capacitor CAP may include the lower electrodes 210, a capacitor dielectric layer 220, an upper electrode 230, and an upper plate electrode 240. A first electrode support 130 and a second electrode support 150 may be formed on the second etch stop layer 380.

The lower electrodes 210, the capacitor dielectric layer 220, the upper electrode 230, the upper plate electrode 240, the first electrode support 130, and the second electrode support 150 included in the capacitor CAP may be substantially the same as those described above with reference to FIGS. 1 through 19.

FIGS. 22 through 34 are views illustrating operations of a method of fabricating a semiconductor device according to at least one example embodiment of the present inventive concepts.

For reference, FIGS. 22, 24, 26, 28, and 29 are plan views illustrating intermediate operations, and FIGS. 23, 25, 27, and 31 are cross-sectional views taken along B-B of FIGS. 22, 24, 26 and 29. FIG. 30 is a cross-sectional view taken along A-A of FIG. 29.

Figure 22:
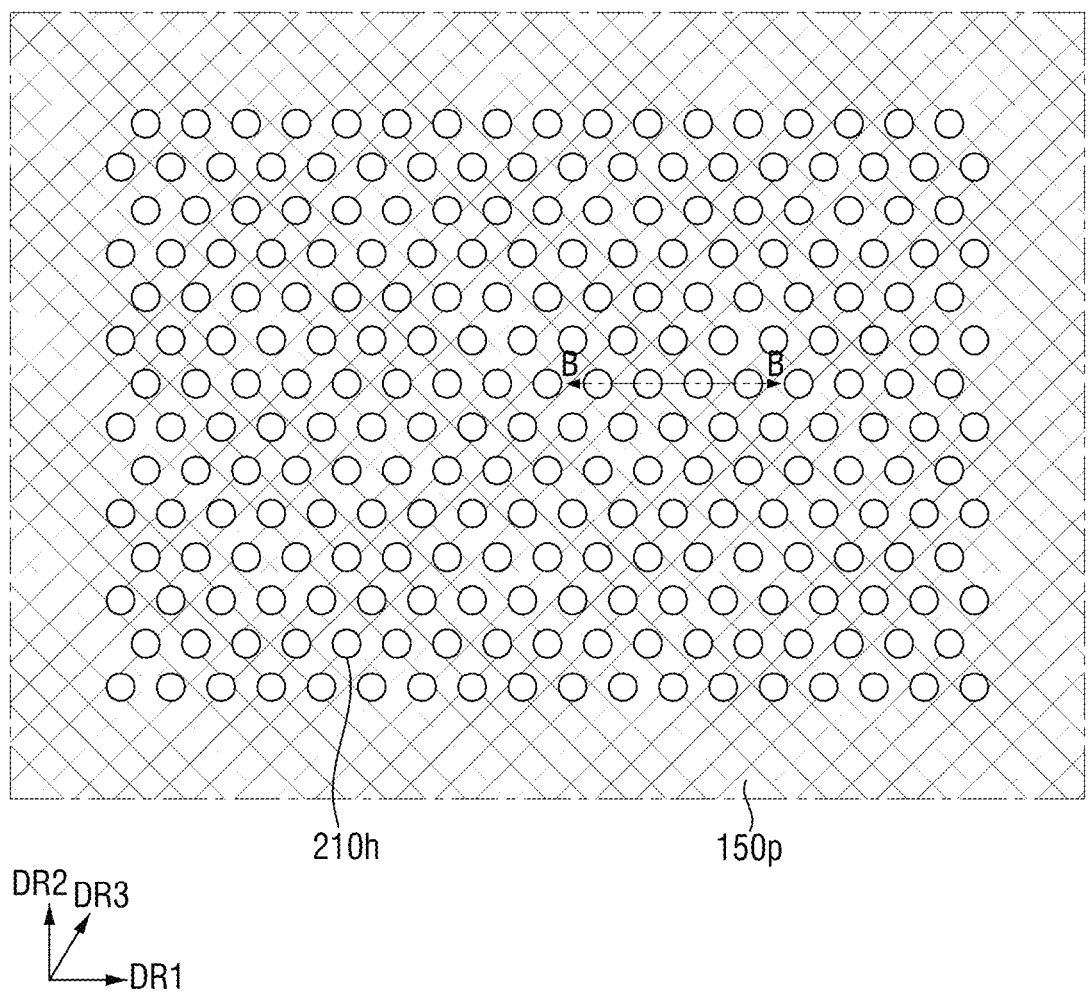
FIGS. 22 through 34 are views illustrating operations of a method of fabricating a semiconductor device according to at least one example embodiment of the present inventive concepts.
Figure 23:
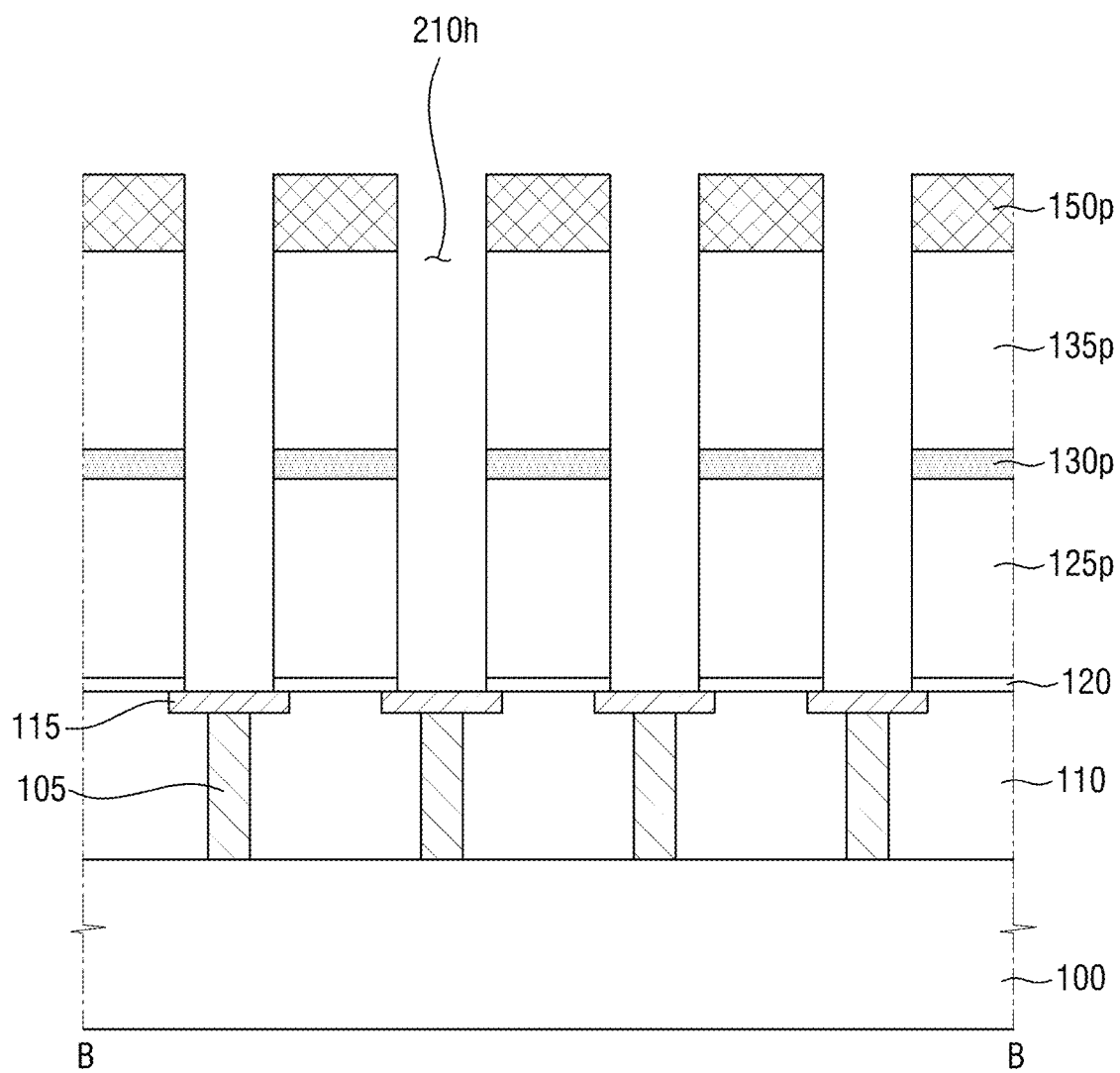

Referring to FIGS. 22 and 23, a mold structure including a plurality of lower electrode holes 210h may be formed on a substrate 100. The lower electrode holes 210h may expose first landing pads 115. The mold structure may include a first mold layer 125p, a first electrode support layer 130p, a second mold layer 135p, and a second electrode support layer 150p sequentially stacked on the substrate 100.

The first mold layer 125p, the first electrode support layer 130p, the second mold layer 135p, and the second electrode support layer 150p may be sequentially formed on the substrate 100. Then, the lower electrode holes 210h may be formed, thereby forming the mold structure on the substrate 100. The lower electrode holes 210h may be formed by etching the sequentially stacked first mold layer 125p, the first electrode support layer 130p, the second mold layer 135p, and the second electrode support layer 150p using a wet and/or dry etching process. The etching process may include a mask (not illustrated) to protect the mold structure during the etching process, and to define the lower electrode holes 210h.

Figure 24:
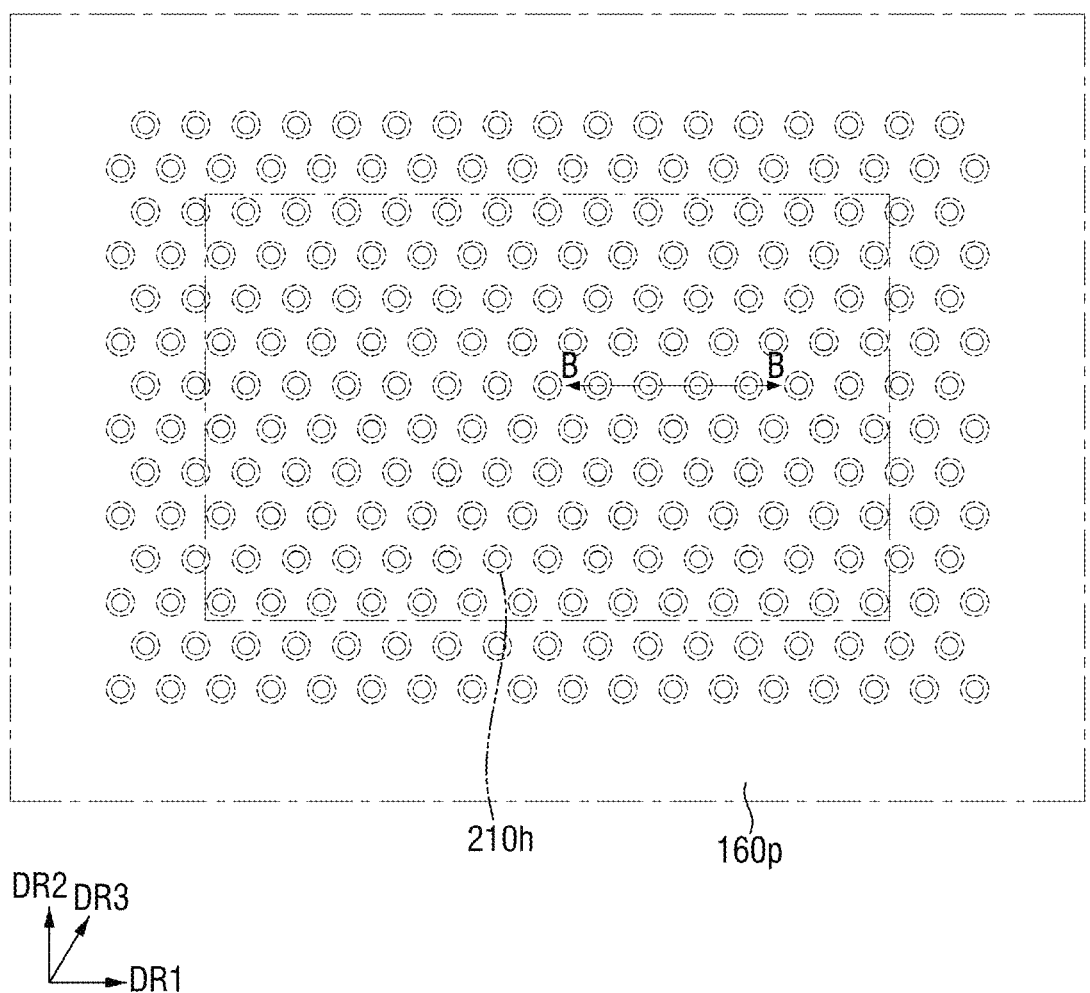
Figure 25:
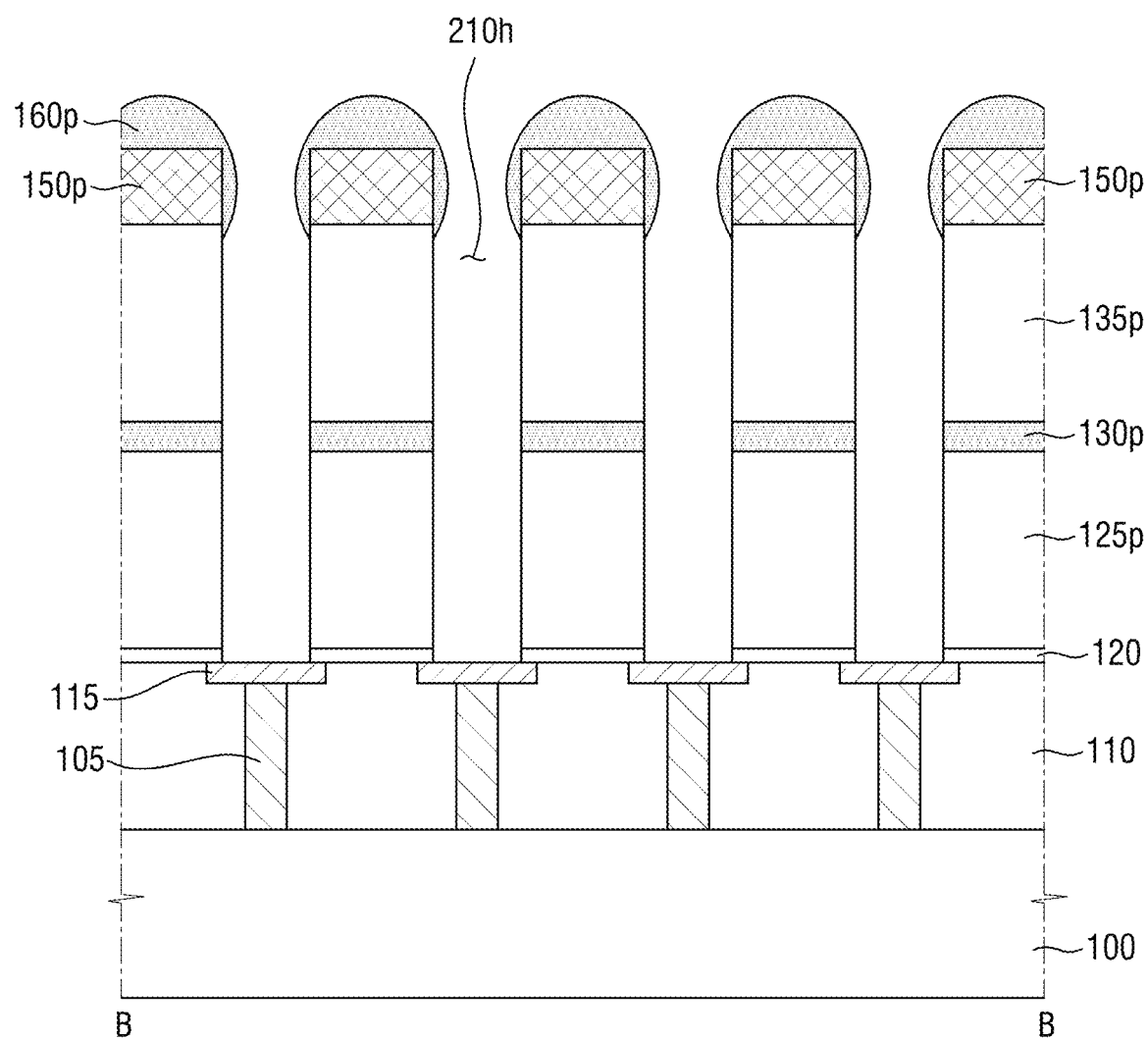

Referring to FIGS. 24 and 25, an insulating spacer layer 160p may be formed on the upper surface and the sidewalls of the lower electrode holes 210h. The insulating spacer layer 160p may cover part of the sidewalls of the lower electrode holes 210h and an upper surface of the second electrode support layer 150p. The insulating spacer layer 160p may entirely cover sidewalls of the second electrode support layer 150p defining the lower electrode holes 210h.

The insulating spacer layer 160p may be formed using a deposition method with poor step coverage. By using this deposition method, the insulating spacer layer 160p may be formed to cover only an upper part of the mold structure, and therefore not forming the insulating spacer layer 160p on the exposed upper surfaces of the first landing pads 115.

Figure 26:
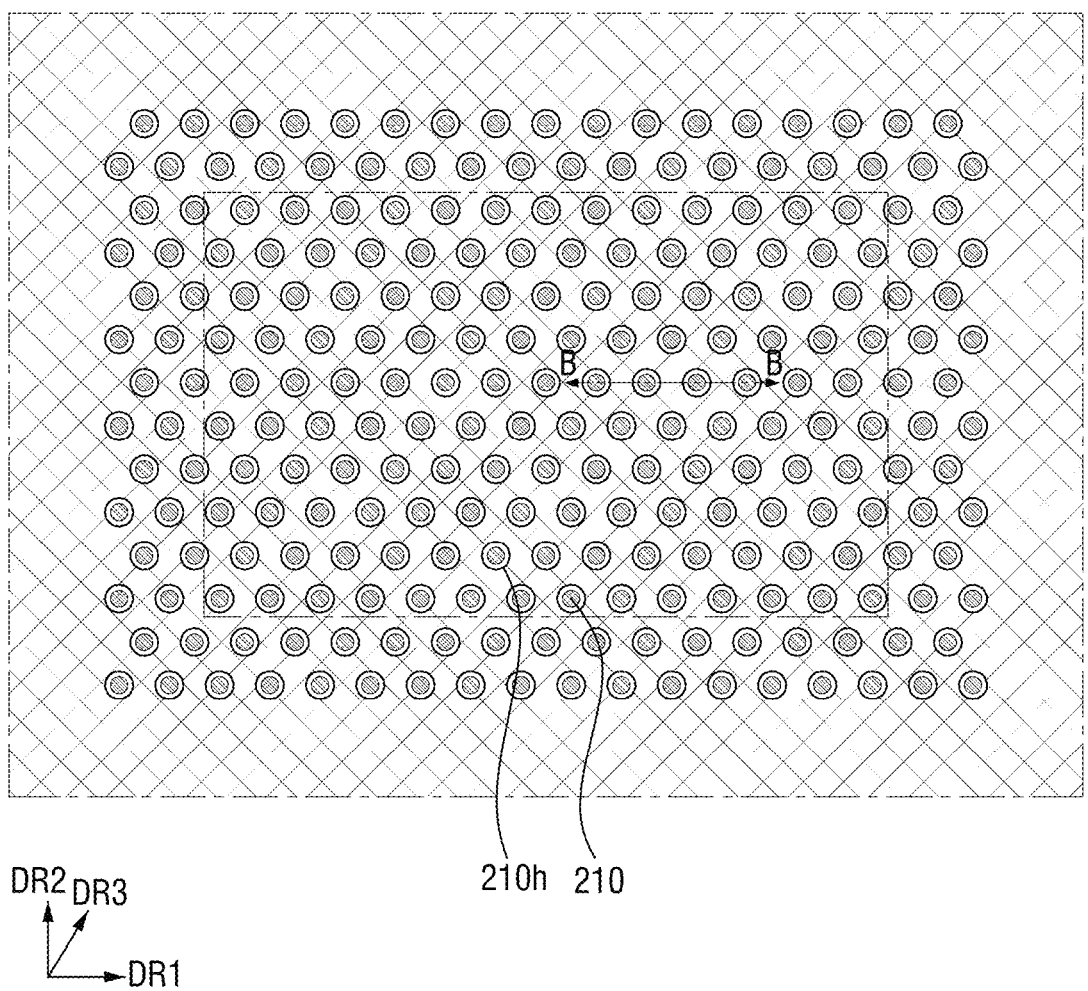
Figure 27:
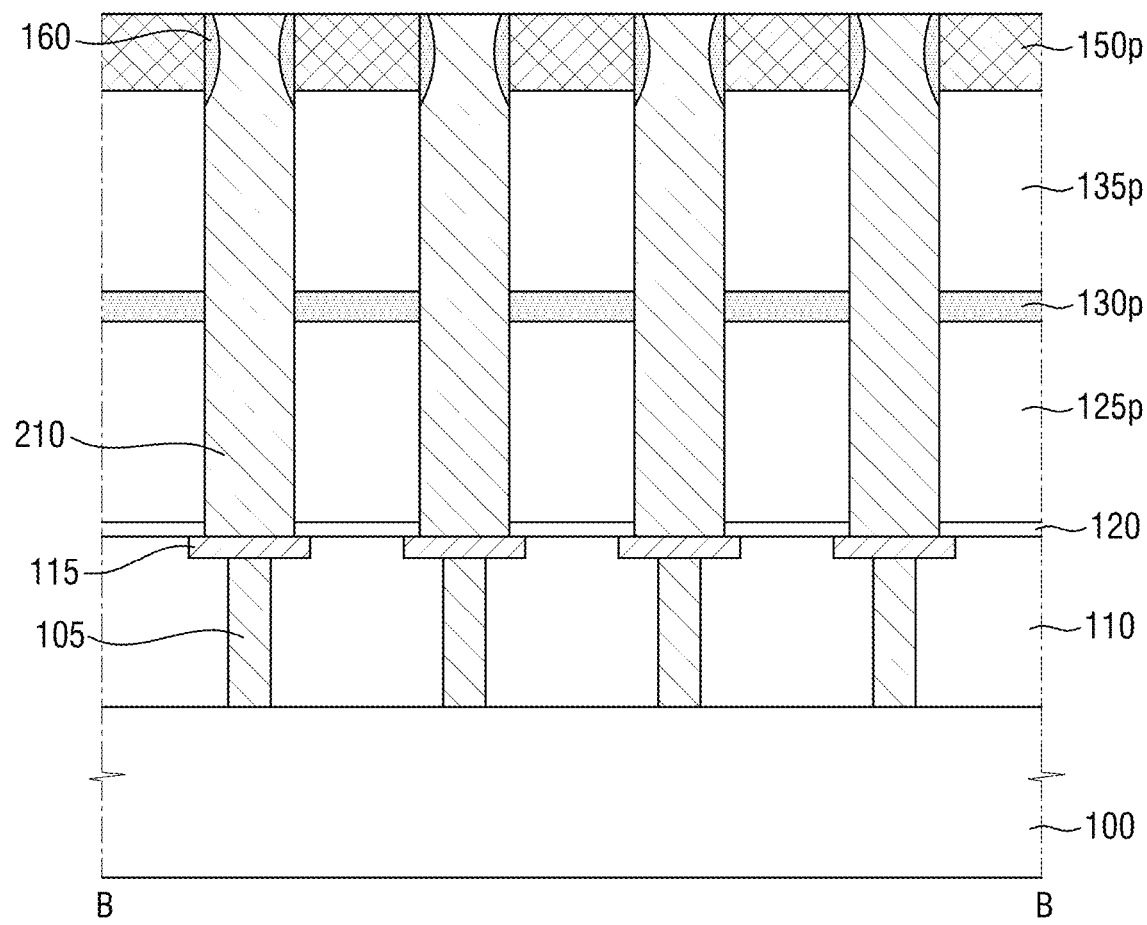

Referring to FIGS. 26 and 27, a lower electrode layer may fill the lower electrode holes 210h in which the insulating spacer layer 160p is formed.

A part of the lower electrode layer and the insulating spacer layer 160p on the upper surface of the second electrode support layer 150p may be removed, for example through a etch-back process or a chemical mechanical polishing process lower electrodes 210 filling the lower electrode holes 210h may be formed. Accordingly, insulating spacers 160 may be formed between the lower electrodes 210 and the second electrode support layer 150p.

Unlike in FIGS. 24 through 27, a sacrificial layer may be formed to fill a part of each of the lower electrode holes 210h. After the insulating spacers 160 are formed on the sidewalls of the lower electrode holes 210h exposed by the sacrificial layer, the sacrificial layer may be removed. After the removal of the sacrificial layer, the lower electrodes 210 may be formed to fill the lower electrode holes 210h.

Figure 28:
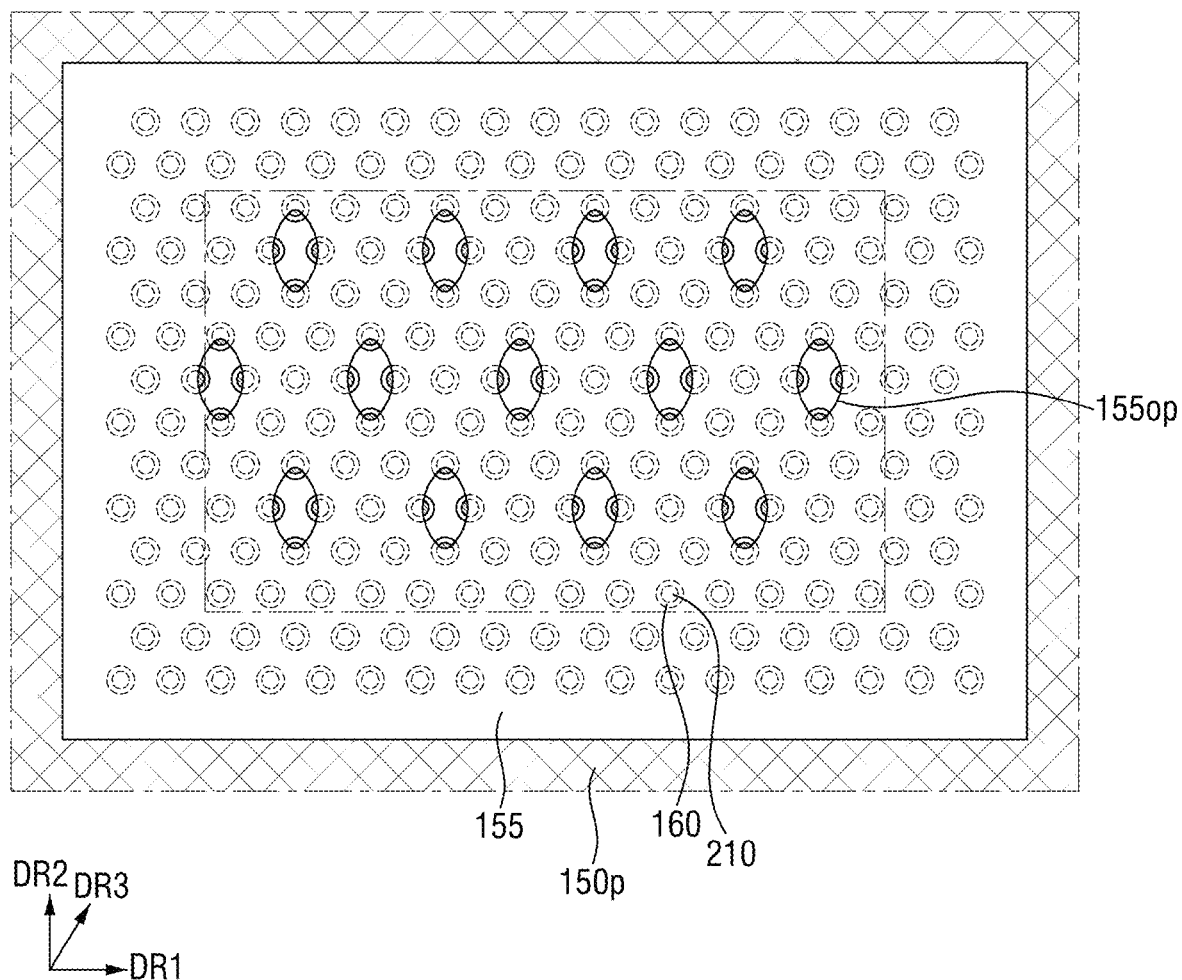

Referring to FIG. 28, a first mask pattern 155 including first openings 155op may be formed on the second electrode support layer 150p and the lower electrodes 210.

The first mask pattern 155 may be a mask used to form a second electrode support 150 (see FIG. 3) and a first electrode support 130 (see FIG. 3). In addition, the first openings 155op may be located at positions corresponding to first through patterns 130tp (see FIG. 4) and second through patterns 150tp (see FIG. 4).

Figure 29:
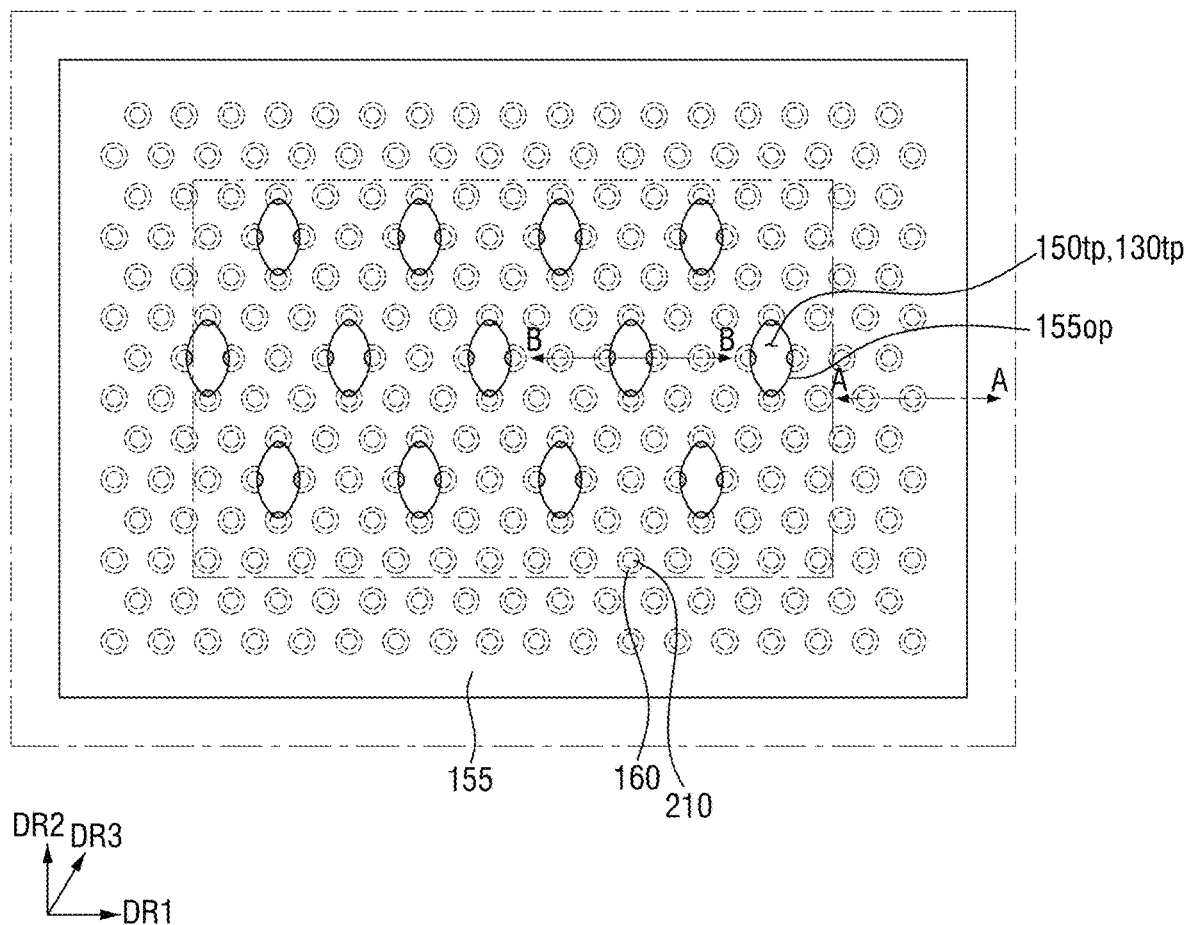
Figure 30:
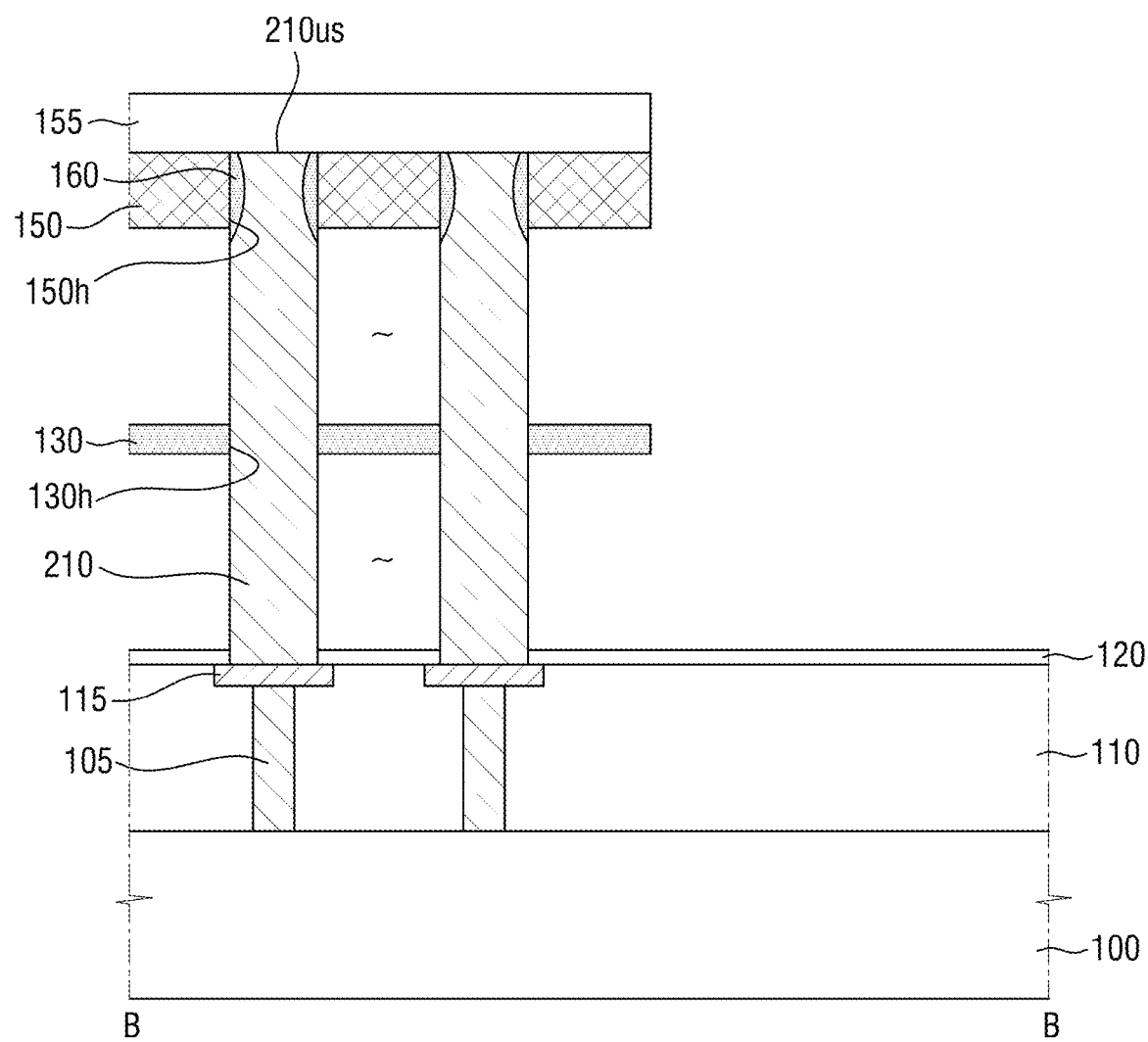
Figure 31:
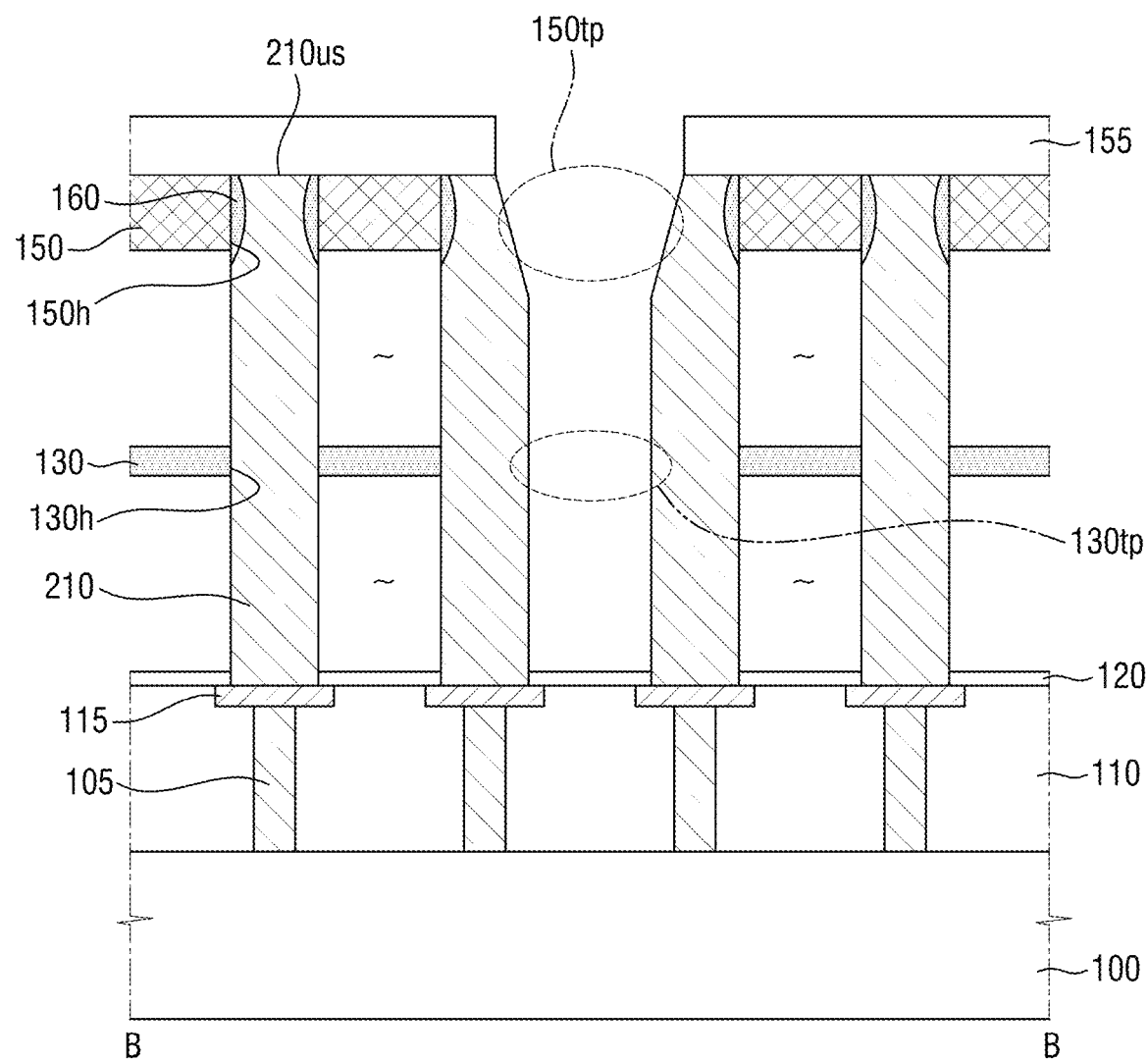

Referring to FIGS. 29 through 31, the second electrode support layer 150p and the first electrode support layer 130p may be patterned using the first mask pattern 155. Accordingly, the first electrode support 130 and the second electrode support 150 may be formed on the substrate 100.

While the first electrode support 130 and the second electrode support 150 are formed, the first through patterns 130tp and the second through patterns 150tp may be formed.

The second electrode support layer 150p may be patterned using the first mask pattern 155, thereby forming the second electrode support 150. While the second electrode support 150 is formed, the second electrode support layer 150p exposed by the first openings 155op may be removed to form the second through patterns 150tp. While the second through patterns 150tp are formed, an upper part of each of the lower electrodes 210 exposed by the first openings 155op may be chamfered.

Then, the exposed second mold layer 135p is removed. The removal of the second mold layer 135p exposes a part of sidewalls of each of the lower electrodes 210.

After the second mold layer 135p is removed, the exposed first electrode support layer 130p may be patterned using the first mask pattern 155. Accordingly, the first electrode support 130 may be formed. While the first electrode support 130 is formed, the first electrode support layer 130p exposed by the first openings 155op may be removed to form the first through patterns 130tp.

Then, the exposed first mold layer 125p is removed. The removal of the first mold layer 125p exposes the other part of the sidewalls of each of the lower electrodes 210. After the removal of the first mold layer 125p, the first mask pattern 155 may be removed.

Figure 32:
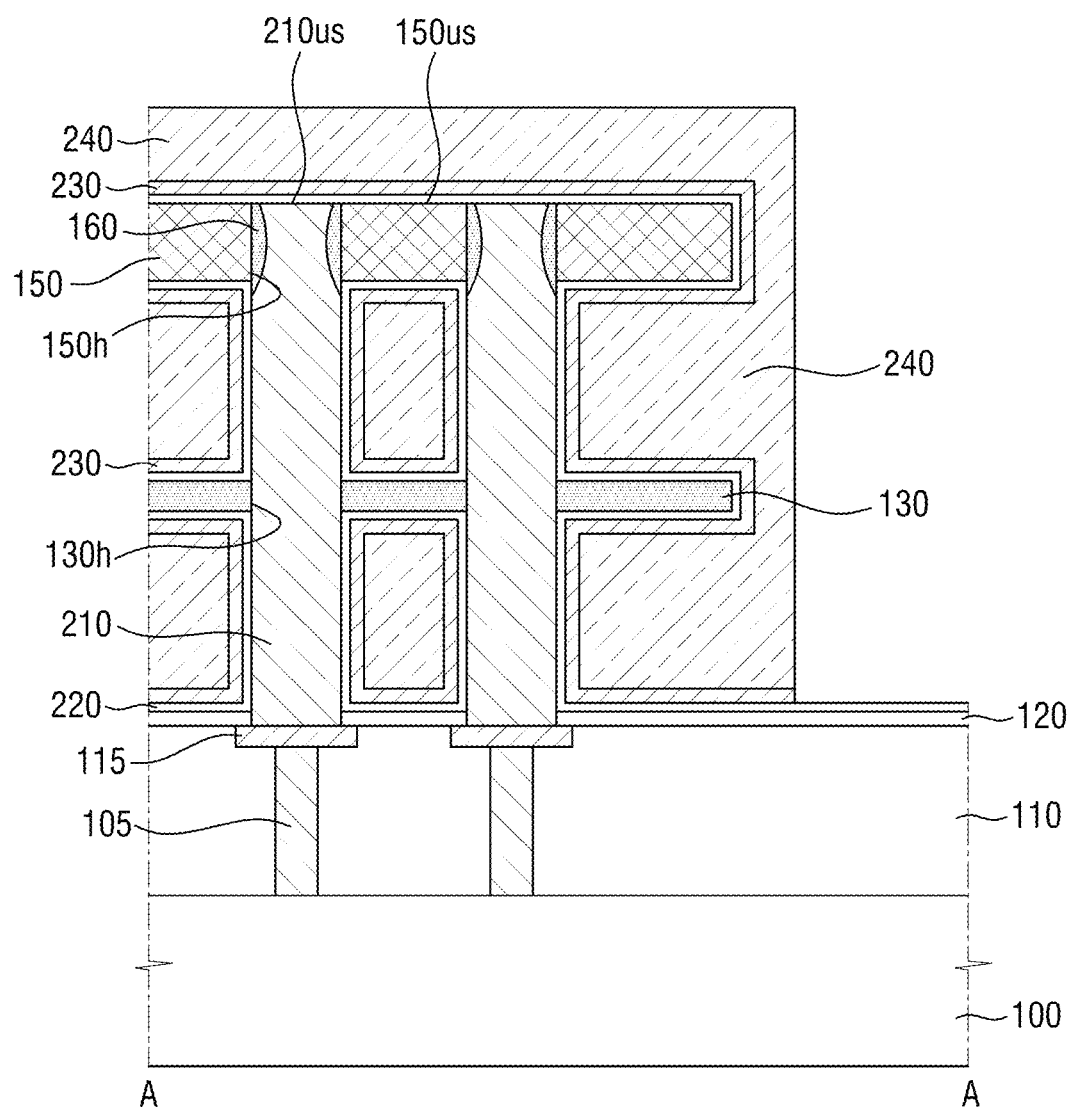

Referring to FIG. 32, a capacitor dielectric layer 220 and an upper electrode 230 may be sequentially formed on the exposed sidewalls of the lower electrodes 210 and upper surfaces 210us of the lower electrodes 210.

The capacitor dielectric layer 220 and the upper electrode 230 are also sequentially formed on an upper surface 150us of the second electrode support 150.

An upper plate electrode 240 may be formed on the upper electrode 230. While the upper plate electrode 240 is formed, the upper electrode 230 may be partially patterned to correspond to the size of the upper plate electrode 240.

Figure 33:
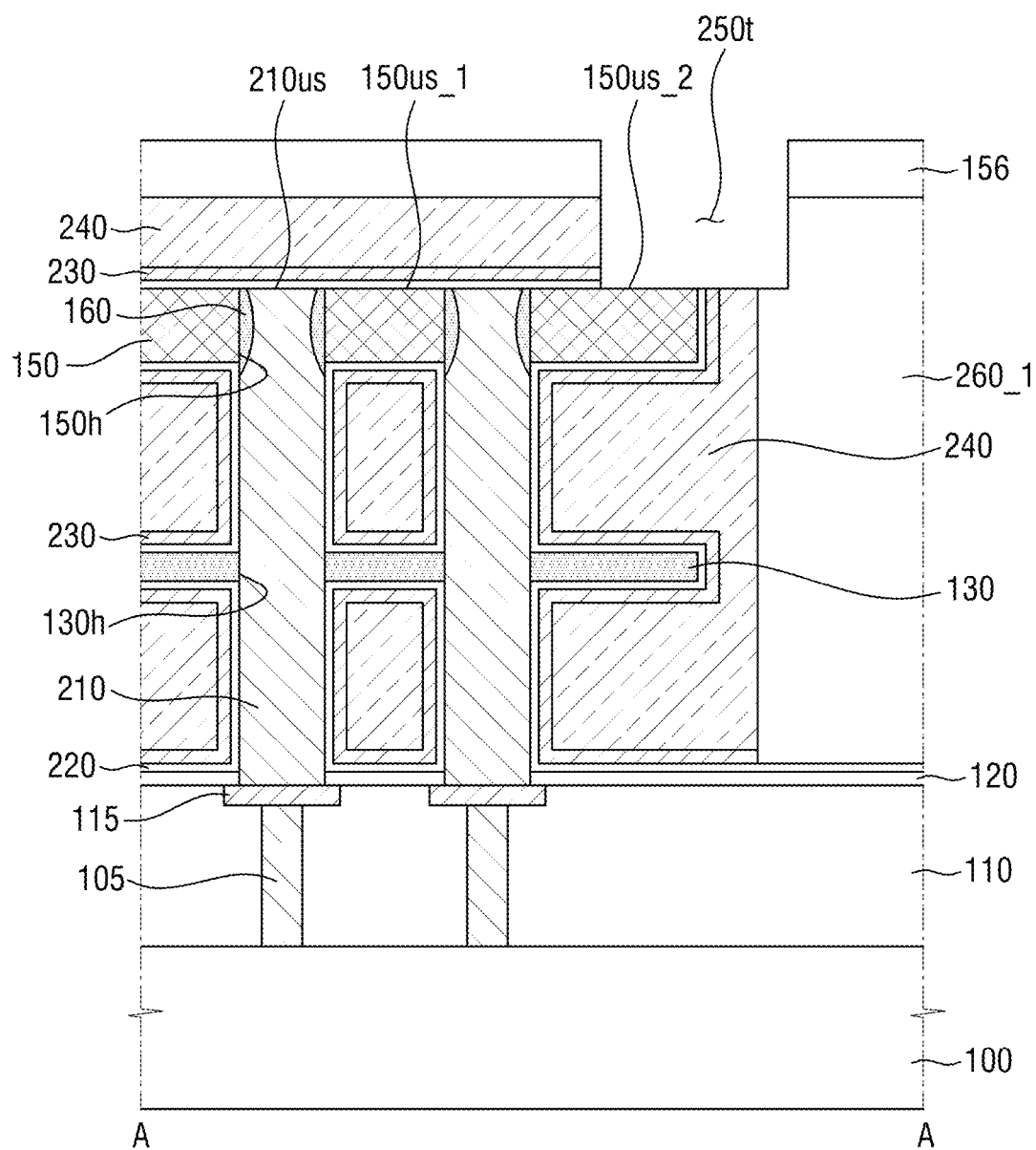

Referring to FIG. 33, the capacitor dielectric layer 220, the upper electrode 230 and the upper plate electrode 240 may be partially removed to expose a part of the second electrode support 150. Accordingly, an exposed area 150us_2 of the upper surface 150us of the second electrode support 150 may be defined.

More specifically, a second lower interlayer insulating film 260_1 may be formed on a first etch stop layer 120 to cover the upper plate electrode 240. The second lower interlayer insulating film 260_1 may expose an upper surface of the upper plate electrode 240, but embodiments are not limited to this case. A second mask pattern 156 may be formed on the second lower interlayer insulating film 260_1. The capacitor dielectric layer 220, the upper electrode 230, and the upper plate electrode 240 may be partially removed using the second mask pattern 156. Accordingly, a connection pattern trench 250t may be formed to expose the exposed area 150us_2 of the upper surface 150us of the second electrode support 150.

Then, the second mask pattern 156 may be removed.

Figure 34:
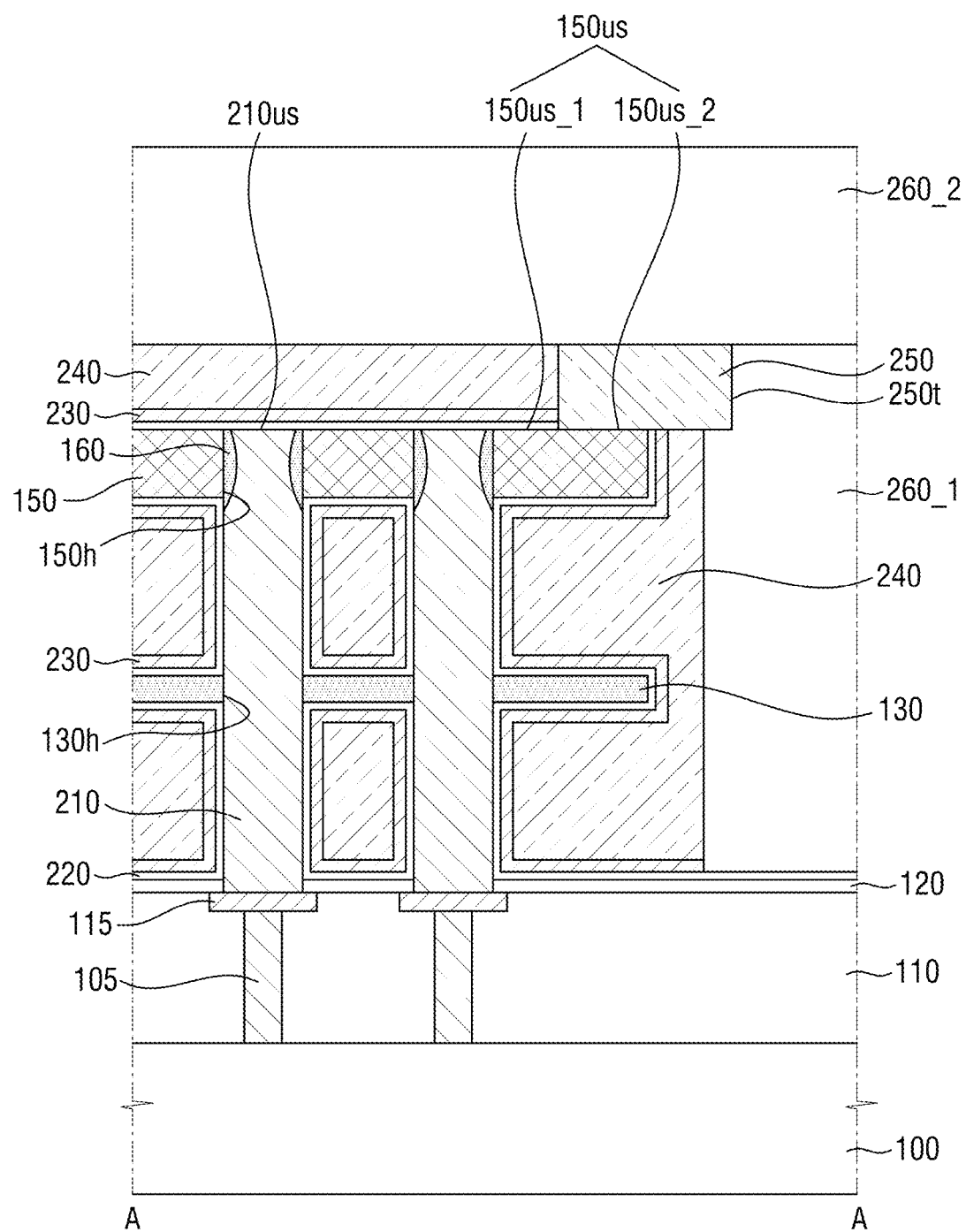

Referring to FIG. 34, a support connection pattern 250 may be formed to fill the connection pattern trench 250t. The support connection pattern 250 may cover the exposed area 150us_2 of the upper surface 150us of the second electrode support 150.

The support connection pattern 250 may be connected to the second electrode support 150 through the exposed area 150us_2 of the upper surface 150us of the second electrode support 150.

A second upper interlayer insulating film 260_2 may be formed on the second lower interlayer insulating film 260_1 to cover upper surfaces of the support connection pattern 250 and the upper plate electrode 240.

Referring to FIG. 3, a first ground plug 270 may be formed in the second upper interlayer insulating film 260_2 which is a part of a second interlayer insulating film 260. The first ground plug 270 may be connected to the upper plate electrode 240. The first ground plug 270 may be electrically connected to the exposed second electrode support 150.

Figure 35:
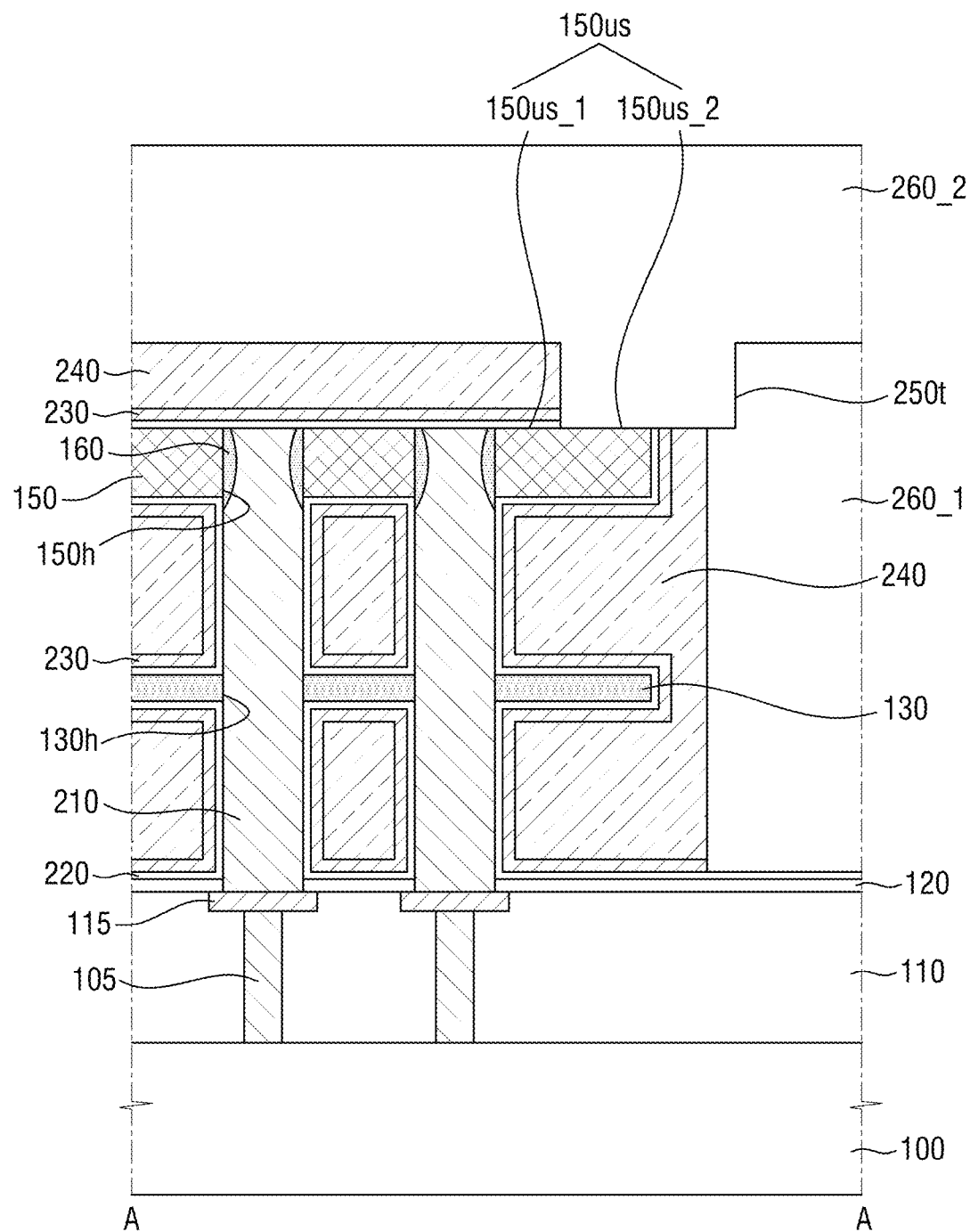
FIG. 35 is a view illustrating an operation of a method of fabricating a semiconductor device according to at least one example embodiment of the present inventive concepts.

FIG. 35 is a view illustrating an operation of a method of fabricating a semiconductor device according to at least one example embodiment of the present inventive concepts. FIG. 35 may be a process performed after FIG. 33.

Referring to FIG. 35, a second upper interlayer insulating film 260_2 may be formed on a second lower interlayer insulating film 260_1 to fill a connection pattern trench 250t.

The second upper interlayer insulating film 260_2 may cover an exposed area 150us_2 of an upper surface 150us of a second electrode support 150.

Referring to FIGS. 9 through 11, a first ground plug 270 and a second ground plug 271 may be formed in the second upper interlayer insulating film 260_2 which is a part of a second interlayer insulating film 260.

The first ground plug 270 may be connected to an upper plate electrode 240, and at least a part of the second ground plug 271 may be connected to the second electrode support 150.

Figure 36:
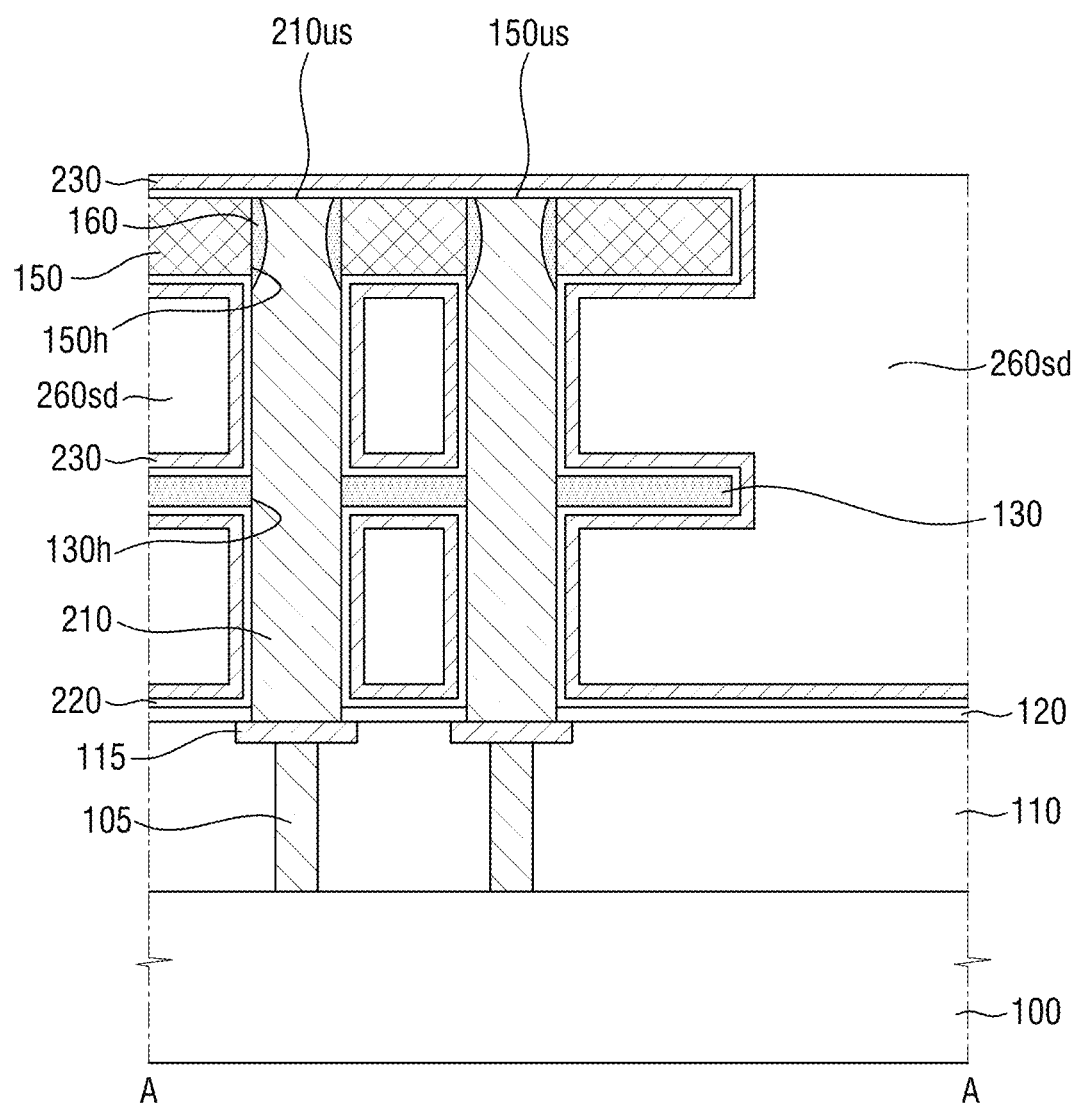
FIGS. 36 through 39 are views illustrating operations of a method of fabricating a semiconductor device according to at least one example embodiment of the present inventive concepts.

FIGS. 36 through 39 are views illustrating operations of a method of fabricating a semiconductor device according to at least one example embodiment of the present inventive concepts. FIG. 36 may be a process performed after FIGS. 29 through 31.

Referring to FIG. 36, a capacitor dielectric layer 220 and an upper electrode 230 may be sequentially formed on exposed sidewalls of lower electrodes 210 and upper surfaces 210us of the lower electrodes 210.

Then, a sacrificial interlayer insulating film 260sd may be formed on a first etch stop layer 120. The sacrificial interlayer insulating film 260sd may expose an upper electrode 230 on an upper surface 150us of a second electrode support 150 and the upper surfaces 210us of the lower electrodes 210.

Figure 37:
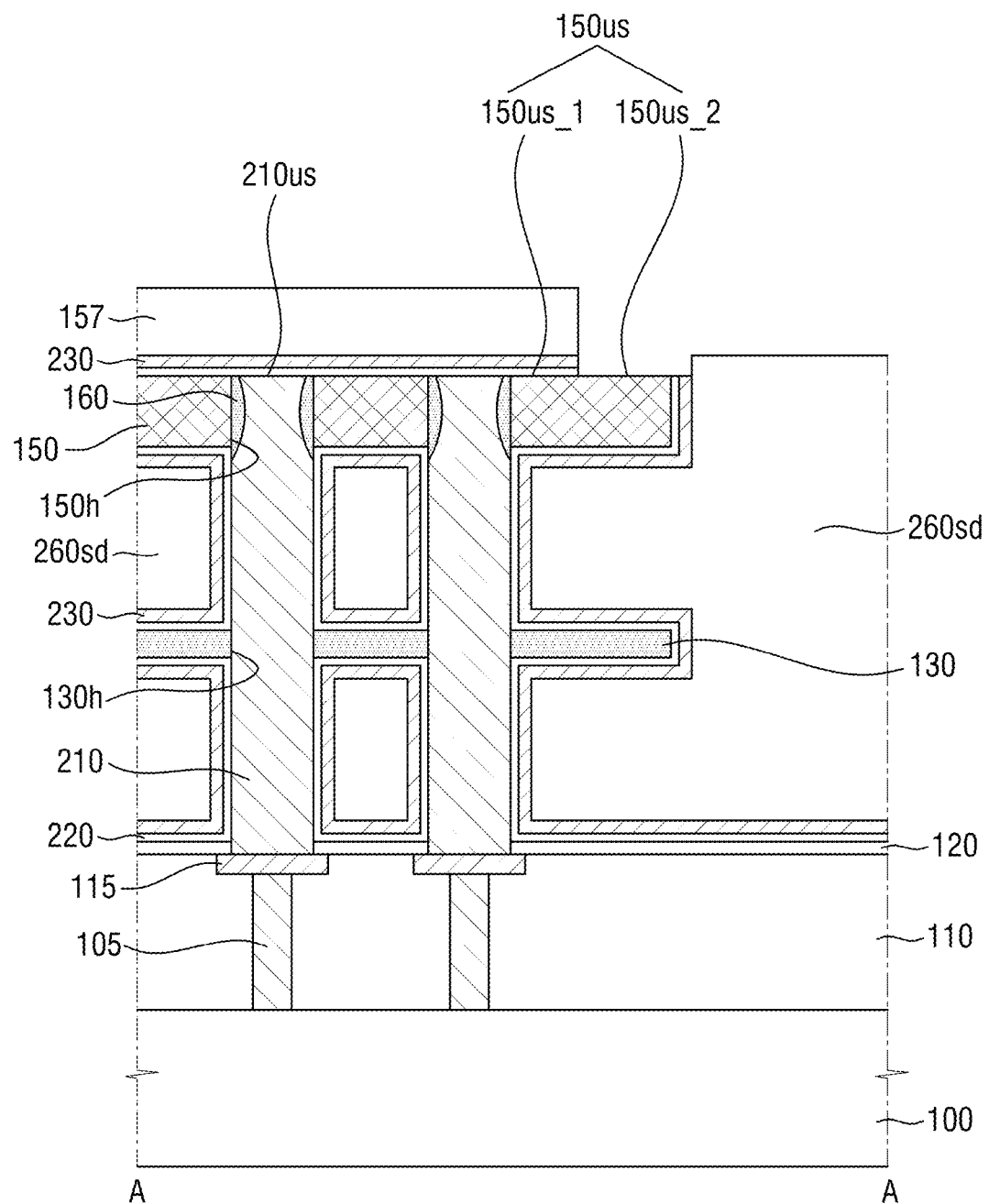

Referring to FIG. 37, a third mask pattern 157 may be formed on the upper electrode 230 and the sacrificial interlayer insulating film 260sd.

The capacitor dielectric layer 220 and the upper electrode 230 may be partially removed using the third mask pattern 157 to expose a part of the second electrode support 150. Accordingly, an exposed area 150us_2 of the upper surface 150us of the second electrode support 150 may be defined.

Then, the third mask pattern 157 may be removed. In addition, the sacrificial interlayer insulating film 260sd may be removed.

Figure 38:
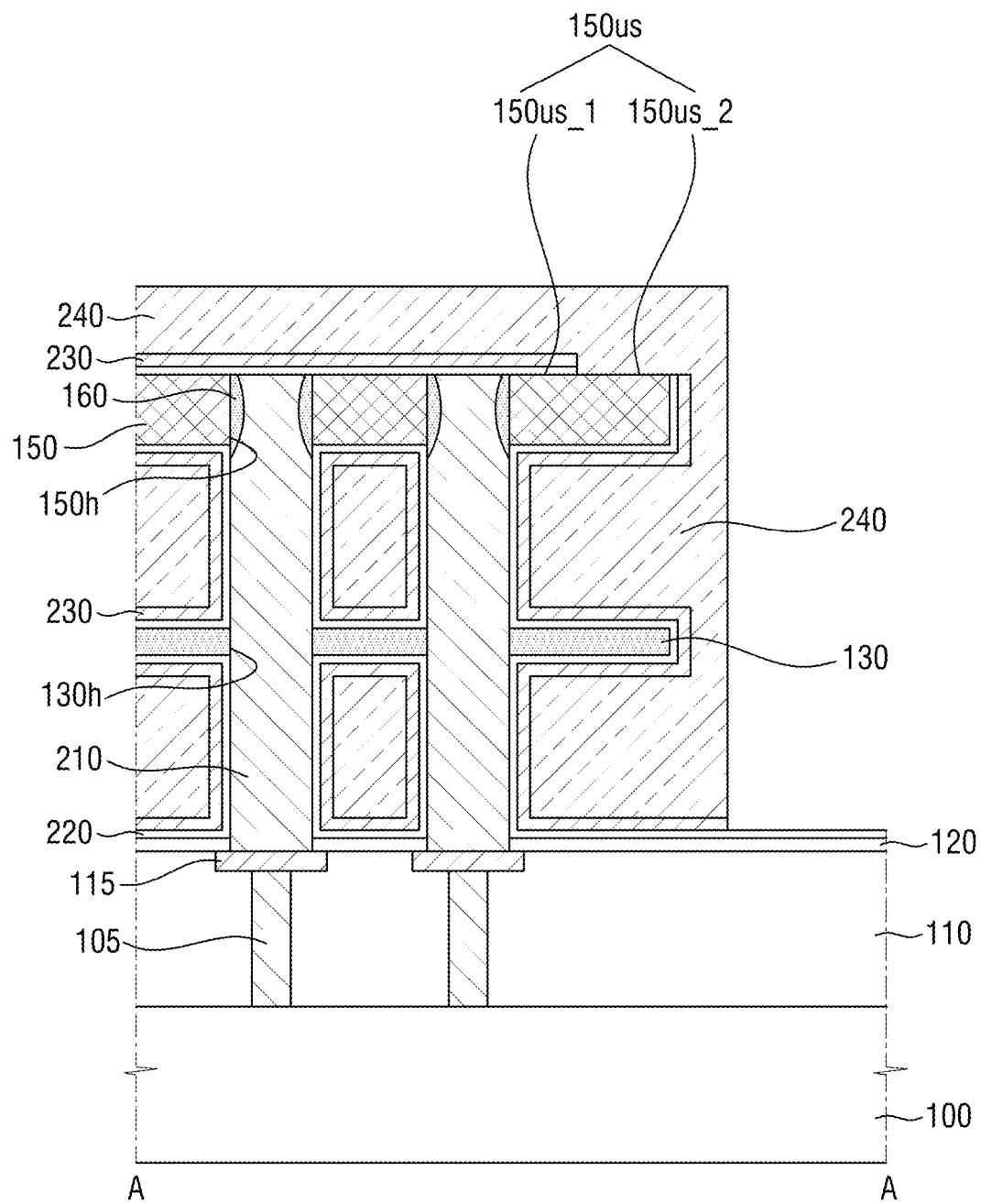

Referring to FIG. 38, an upper plate electrode 240 may be formed on the upper electrode 230. The upper plate electrode 240 may cover the exposed area 150us_2 of the upper surface 150us of the second electrode support 150.

The upper plate electrode 240 may be connected to the second electrode support 150 through the exposed area 150us_2 of the upper surface 150us of the second electrode support 150.

Figure 39:
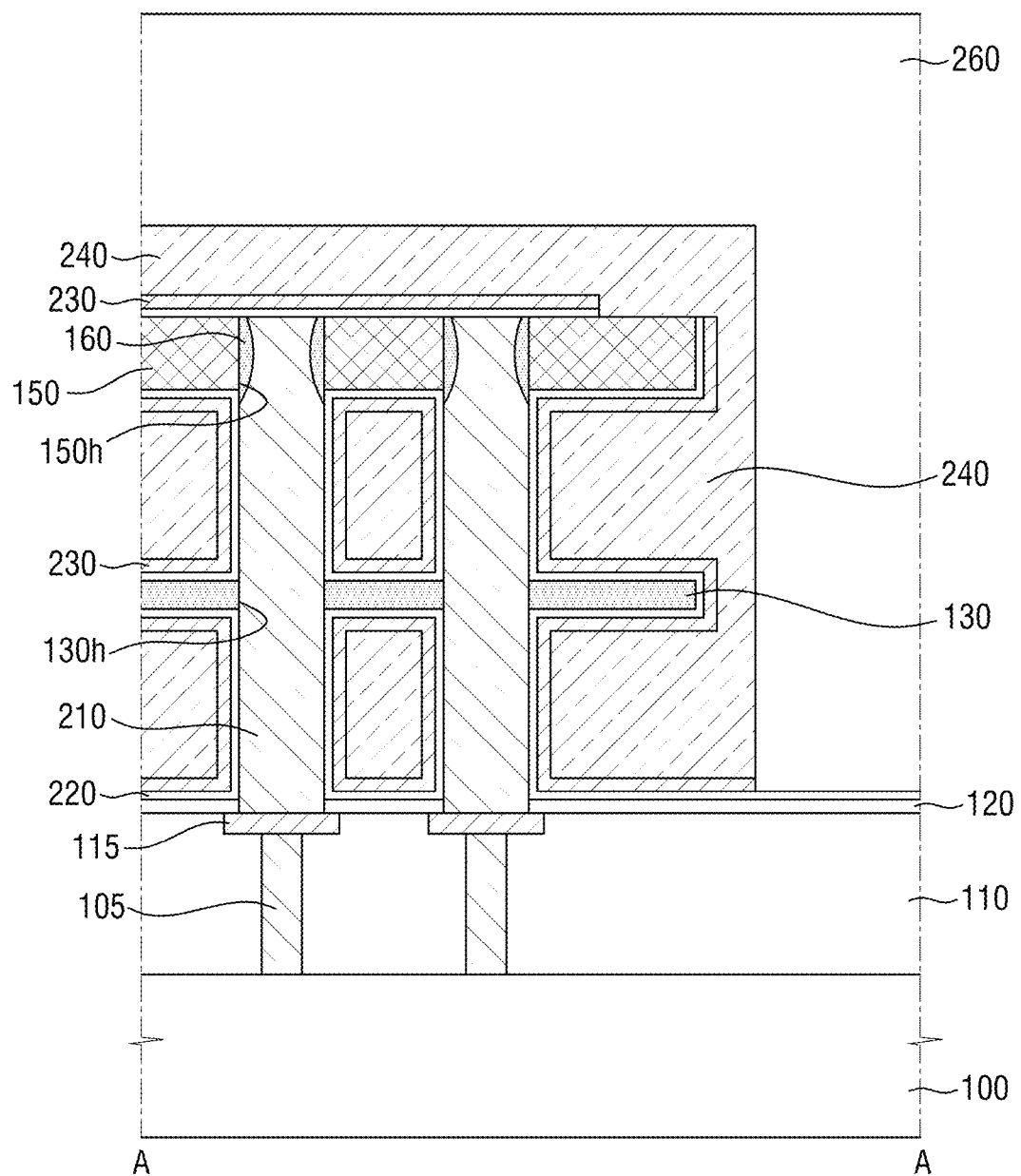

Referring to FIG. 39, a second interlayer insulating film 260 may be formed on the upper plate electrode 240.

Referring to FIG. 8, a first ground plug 270 may be formed in the second interlayer insulating film 260.

Figure 40:
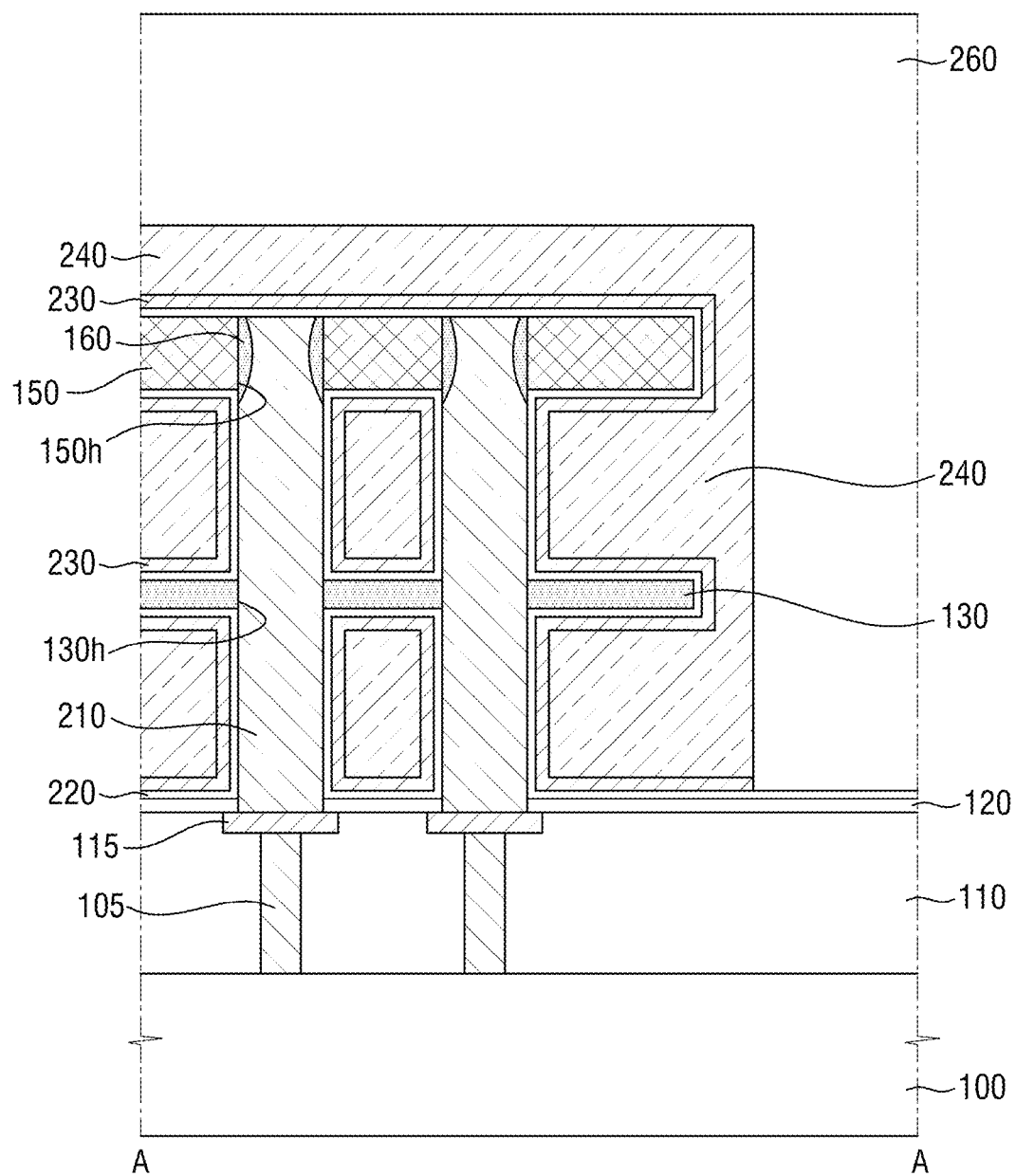
FIG. 40 is a view illustrating an operation of a method of fabricating a semiconductor device according to at least one example embodiment of the present inventive concepts.

FIG. 40 is a view illustrating an operation of a method of fabricating a semiconductor device according to at least one example embodiment of the present inventive concepts. FIG. 40 may be a process performed after FIG. 32.

Referring to FIGS. 15 and 40, a second interlayer insulating film 260 may be formed on an upper plate electrode 240.

A second ground plug 271 may pass through the second interlayer insulating film 260, the upper plate electrode 240, an upper plate 230 and a capacitor dielectric layer 220 and then be connected to a second electrode support 150. The second ground plug 271 may be connected to an edge part 150_2 of the second electrode support 150.

In concluding the detailed description, those skilled in the art will appreciate that many variations and modifications may be made to the preferred embodiments without substantially departing from the principles of the present inventive concepts. Therefore, the disclosed preferred embodiments of the inventive concepts are used in a generic and descriptive sense only and not for purposes of limitation.

What is claimed is:

1. A semiconductor device comprising:
a plurality of lower electrodes extending vertically from an upper surface of a substrate;
a first electrode support between adjacent lower electrodes of the plurality of lower electrodes, the first electrode support comprising a conductive material;
a dielectric layer on the plurality of lower electrodes and the first electrode support and extending along profiles of the first electrode support and each of the plurality of lower electrodes; and
an upper electrode on the dielectric layer and encircling at least one of the plurality of lower electrodes,
wherein the first electrode support is vertically over a portion of the upper electrode.

2. The semiconductor device of claim 1, further comprising insulating spacers between the first electrode support and each of the lower electrodes.

3. The semiconductor device of claim 2, wherein the insulating spacers comprise an insulating material having a greater dielectric constant than silicon oxide.

4. The semiconductor device of claim 2, wherein
the first electrode support comprises a first surface and a second surface opposite to each other,
the first surface of the first electrode support facing the substrate, and
a distance from the second surface of the first electrode support to a bottom of the insulating spacers is greater than a thickness of the first electrode support.

5. The semiconductor device of claim 1, further comprising
a ground plug connected to the upper electrode,
wherein the first electrode support is electrically connected to the ground plug.

6. The semiconductor device of claim 1, further comprising
a second electrode support between the substrate and the first electrode support, the second electrode support comprising an insulating material.

7. The semiconductor device of claim 1, wherein the lower electrodes and the first electrode support do not contact each other.

8. The semiconductor device of claim 1, wherein each of the lower electrodes has a pillar shape extending away from an upper surface of a substrate.

9. A semiconductor device comprising:
a plurality of lower electrodes on a substrate;
an electrode support, comprising a conductive material, between adjacent lower electrodes of the plurality of lower electrodes, and comprising a support exposed area on an upper surface of the electrode support;
a dielectric layer on the electrode support and the lower electrodes but not on the support exposed area of the electrode support;
an upper electrode on the dielectric layer;
an upper plate electrode on the upper electrode and electrically connected to the electrode support; and
a ground plug connected to the upper plate electrode.

10. The semiconductor device of claim 9, wherein
the electrode support comprises an electrode support part and an edge part surrounding the electrode support part,
the lower electrodes are in the electrode support part, and
the edge part of the electrode support comprises the support exposed area.

11. The semiconductor device of claim 10, wherein
the upper surface of the electrode support comprises a first boundary line extending in a first direction and a second boundary line extending in a second direction different from the first direction, and
the support exposed area extends along the first boundary line of the upper surface of the electrode support.

12. The semiconductor device of claim 11, wherein the support exposed area extends along the second boundary line of the upper surface of the electrode support.

13. The semiconductor device of claim 9, wherein the upper plate electrode covers the support exposed area.

14. The semiconductor device of claim 9, further comprising
a support connection pattern connected to the support exposed area and to the upper plate electrode.

15. The semiconductor device of claim 9, wherein the ground plug is electrically connected to the electrode support through the support exposed area.

16. The semiconductor device of claim 9, further comprising
insulating spacers between the electrode support and each of the lower electrodes.

17. The semiconductor device of claim 9, wherein the electrode support comprises a conductive material.

18. A semiconductor device comprising:
a trench in a substrate;
a gate electrode filling a part of the trench;
a source/drain region adjacent to the gate electrode and laterally overlapping a part of the gate electrode;
a contact plug connected to the source/drain region;
a landing pad on the contact plug;
an etch stop layer on the landing pad and exposing at least a part of the landing pad;
a lower electrode connected to the landing pad;

a first electrode support on sidewalls of the lower electrode and spaced apart from the etch stop layer, the first electrode support comprising an insulating material;

a second electrode support on the sidewalls of the lower electrode and spaced apart from the first electrode support, the second electrode support comprising a conductive material;

an insulating spacer electrically isolating the second electrode support from the lower electrode;

an upper electrode; and a dielectric layer on the lower electrode, the first electrode support and the second electrode support extending along profiles of the lower electrode, the first electrode support, and the second electrode support such that the dielectric layer is between the upper electrode and the first electrode support, and between the upper electrode and the lower electrode.

19. The semiconductor device of claim 18, wherein the insulating spacer comprises a part whose thickness increases as a distance from the substrate increases.

20. The semiconductor device of claim 18, wherein an upper surface of the second electrode support comprises a support exposed area on which the dielectric layer and the upper electrode are not formed, and the second electrode support is electrically connected to the upper electrode through the support exposed area.

\* \* \* \* \*